United States Patent
Tsukiji et al.

(10) Patent No.: US 8,270,447 B2
(45) Date of Patent: Sep. 18, 2012

(54) SEMICONDUCTOR LIGHT EMITTING ELEMENT AND MANUFACTURING METHOD THEREOF

(75) Inventors: Naoki Tsukiji, Chiba (JP); Norihiro Iwai, Tokyo (JP); Keishi Takaki, Tokyo (JP); Koji Hiraiwa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 144 days.

(21) Appl. No.: 12/684,109

(22) Filed: Jan. 7, 2010

(65) Prior Publication Data

US 2010/0232465 A1    Sep. 16, 2010

(30) Foreign Application Priority Data

Jan. 8, 2009  (JP) ................................. 2009-002793
Jan. 7, 2010  (JP) ................................. 2010-002399

(51) Int. Cl.
*H01S 5/00*  (2006.01)

(52) U.S. Cl. ........... 372/45.01; 372/46.013; 372/50.124; 372/87

(58) Field of Classification Search ................ 372/45.01
See application file for complete search history.

(56) References Cited

U.S. PATENT DOCUMENTS

| | | | |
|---|---|---|---|
| 6,750,071 B2 | 6/2004 | Chirovsky et al. | |
| 6,751,245 B1* | 6/2004 | Wasserbauer et al. | 372/46.01 |
| 6,916,672 B2 | 7/2005 | Chirovsky et al. | |
| 2005/0180481 A1* | 8/2005 | Kaneko et al. | 372/50.21 |
| 2005/0286597 A1* | 12/2005 | Mukoyama et al. | 372/50.23 |

* cited by examiner

*Primary Examiner* — Tod T Van Roy
*Assistant Examiner* — Xinning Niu
(74) *Attorney, Agent, or Firm* — Solaris Intellectual Property Group, PLLC

(57) ABSTRACT

A semiconductor light emitting element, comprises: an active layer; a first electrode and second electrode that inject current to the active layer; a semiconductor layer between the active layer and the first electrode; and a dielectric layer that is provided on the semiconductor layer and through which light from the active layer passes; wherein the first electrode is provided on the semiconductor layer, has an opening through which light from the active layer passes, and comprises a first electrode layer that comes in contact with and is provided on the semiconductor layer, and a second electrode layer that is provided on the first electrode layer, with the first electrode layer having less reactivity with the semiconductor layer than the second electrode layer; and the dielectric layer is provided inside the opening such that the end section on the opening side of the first electrode layer extends from the top of the semiconductor layer to the top of the dielectric layer.

11 Claims, 16 Drawing Sheets

SEMICONDUCTOR LIGHT EMITTING ELEMENT AND MANUFACTURING METHOD THEREOF

CROSS-REFERENCE TO RELATED APPLICATIONS

This application claims priority under 35 USC 119 from Japanese Patent Application No. 2009-002793 filed on Jan. 8, 2009 and Japanese Patent Application No. 2010-002399 filed on Jan. 7, 2010, the disclosures of which are incorporated by reference herein.

BACKGROUND

1. Technical Field

The present invention relates to a semiconductor light-emitting element and the manufacturing method thereof, and more particularly to a Vertical Cavity Surface Emitting Laser (VCSEL, hereafter simply referred to as a surface emitting laser) element and the manufacturing method thereof.

2. Related Art

A conventional surface emitting laser element is disclosed for example in U.S. Pat. No. 6,916,672 and U.S. Pat. No. 6,750,071, and has an active layer having quantum well structure with a p-side ring electrode on a p+ type contact layer that is provided via a p-type spacer layer that is between the p+ contact layer and active layer, and a dielectric layer for adjusting the phase is provided in the opening of the p-side ring electrode.

In a semiconductor light-emitting element that is constructed having an active layer and two electrodes that inject electric current into the active layer, where one of the two electrodes is provided on the semiconductor layer with an opening being provided in that electrode for letting light pass from the active layer, and a dielectric layer is provided in that opening, there is a problem in that in the end section on the side of the electrode opening, at least one of the component materials of the electrode diffuses into the semiconductor layer and reacts with the semiconductor layer, and as a result, deformation occurs in the semiconductor layer near the boundary surface between the semiconductor layer and the electrode.

SUMMARY

The object of the present invention is to provide a semiconductor light emitting element and manufacturing method thereof, wherein the semiconductor light emitting element is constructed having an electrode with an opening provided on the semiconductor layer and a dielectric layer provided in that opening, and is capable of suppressing the occurrence of deformation in the semiconductor layer near the boundary surface between the semiconductor layer and the end section on the side of the electrode opening.

According to one preferable aspect of the present invention, a semiconductor light emitting element is provided that comprises:

an active layer;
a first electrode and second electrode that inject current to the active layer;
a semiconductor layer between the active layer and the first electrode; and
a dielectric layer that is provided on the semiconductor layer and through which light from the active layer passes; wherein
the first electrode is provided on the semiconductor layer, has an opening through which light from the active layer passes, and comprises a first electrode layer that comes in contact with and is provided on the semiconductor layer, and a second electrode layer that is provided on the first electrode layer, with the first electrode layer having less reactivity with the semiconductor layer than the second electrode layer; and
the dielectric layer is provided mainly inside the opening such that the end section on the opening side of the first electrode layer extends from the top of the semiconductor layer to the top of the dielectric layer.

According to another preferable aspect of the present invention, a semiconductor light emitting element is provided that comprises:

an active layer;
a first electrode and second electrode that inject current to the active layer;
a semiconductor layer between the active layer and the first electrode; and
a dielectric layer that is provided on top of the semiconductor layer and through which light from the active layer passes; wherein
the first electrode is provided on top of the semiconductor layer, has an opening through which light from the active layer passes, and comprises a first electrode layer that comes in contact with and is provided on the semiconductor layer, and a second electrode layer that is provided on top of the first electrode layer, with the first electrode layer having less reactivity with the semiconductor layer than the second electrode layer; and
the dielectric layer is provided inside the opening, with the end section of the dielectric layer being located between the end section on the opening side of the first electrode and the end section on the opening side of the second electrode.

According to yet another preferable aspect of the present invention, a manufacturing method for a semiconductor light emitting element is provided that comprises:

a step of forming an active layer and semiconductor layer on a substrate;
a step of selectively forming a dielectric layer on the semiconductor layer;
a step of selectively forming an electrode on the semiconductor layer, wherein
the electrode has a first electrode layer, a second electrode layer that is provided on the first electrode layer, and an opening;
the first electrode comes in contact with and is provided on the semiconductor layer;
the first electrode layer has less reactivity with the semiconductor layer than the second electrode layer;
the dielectric layer is located inside the opening;
and the end section on the opening side of the first electrode layer extends from the top of the semiconductor layer to the top of the dielectric layer; and
an oxidation step of forming an oxide area in a current path restriction layer, which is a current path restriction layer that restricts the path of current flowing from the electrode to the active layer or restricts the path of current flowing from the active layer to the electrode, and has an area where the current flows and an oxide area that restricts the flow of the current; wherein by performing heating during the oxidation step, forms a material layer between the first electrode layer and the semiconductor layer that includes at least one of the component mate-

DETAILED DESCRIPTION

A surface emitting semiconductor laser element and manufacturing method thereof of preferred embodiments of the present invention will be explained in detail below with reference to the drawings. The invention is not limited by these embodiments.

Figure 13:
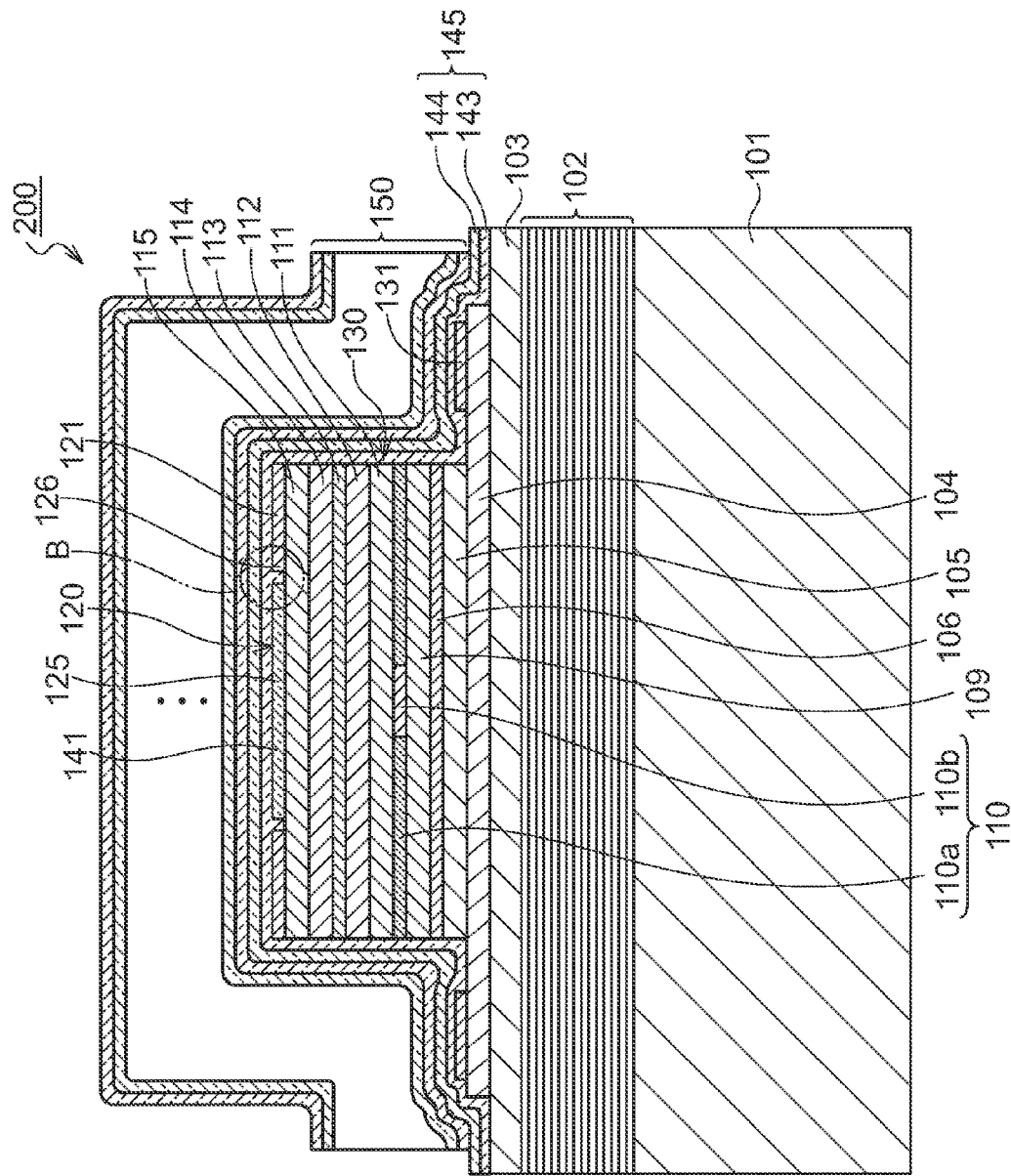
FIG. 13 is a vertical cross-sectional drawing for explaining a surface emitting semiconductor laser element for comparison.

Before explaining the preferred embodiments of the present invention, first, a comparative example will be explained. Referencing FIG. 13, the surface emitting laser 300 of this comparative example comprises a GaAs substrate 101 and a stacked structure that is layered on the surface thereof, with part of the structure forming a mesapost 130. The stacked structure comprises in order as seen from the side of the GaAs substrate a lower DBR mirror 102 made of semiconductor multilayer film, a buffer layer 103, an n+ type contact layer 104, n type spacer layer 105, an active layer 106 having quantum well structure, a lower graded composition layer 109, a current constriction layer 110, an upper graded composition layer 111, a p type spacer layer 112, a p+ type current path layer 113, a p type spacer layer 114, and a p+ type contact layer 115. A p-side ring electrode 121 is formed on the p+ type contact layer 115, and a disk shaped dielectric layer 141 that is made of silicone nitride and functions as a phase adjustment layer is formed inside the opening 125 of the p-side ring electrode 121. There is a gap between the p-side ring electrode 121 and the dielectric layer 141. An upper DBR mirror 150 made of a dielectric multilayer film is formed on the p-side ring electrode 121 and dielectric layer 141. The current constriction layer 110 includes a current constriction section 110a that is located on the outside, and a disk shaped current injection section 110b that is located on the inside of the current constriction section 110a. In this example, the semiconductor layered structure from the n type spacer layer 105 to the p+ type contact layer 115 forms a cylindrical shaped mesapost 130.

The current that is injected from the p-side ring electrode 121 is injected into the active layer via the current constriction layer 110 and generates laser light.

In the surface emitting laser 300 of the comparative example, there is a problem in that in the edge section (end section 126 on the opening side), which is the inner edge of the p-side ring electrode, the thickness of the electrode layer that is formed becomes thin, or unevenness occurs in the end section 126 on the opening side. Ti is often used to get low resistant ohmic contact to GaAs layer, and metals such as Pt or Au are often used for functions as barria layer or low electric resistant wiring layer.

Figure 14:
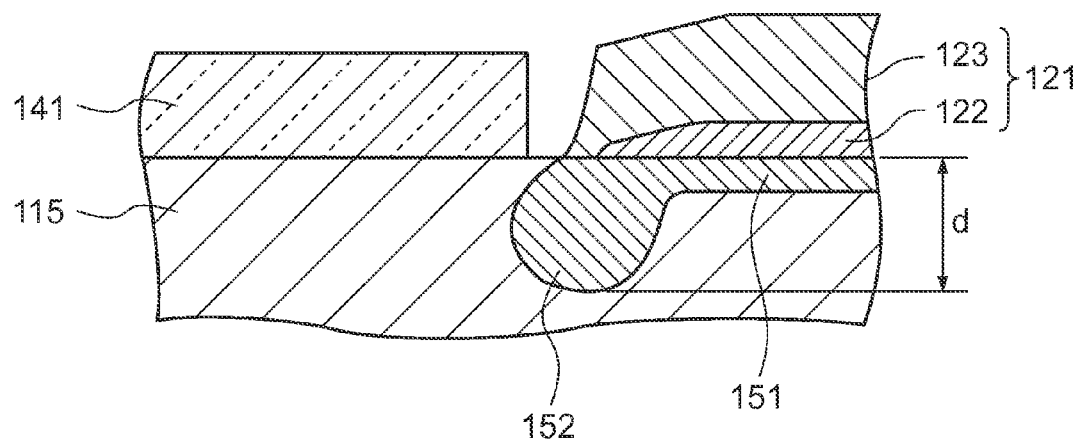
FIG. 14 is a partial enlarged cross-sectional drawing of B of FIG. 13.

For example, as illustrated in FIG. 14, a Ti/Pt (lower side is a Ti layer 122, and the upper side is a Pt layer 123) multilayer metal is used as the electrode material of the p-side ring electrode 121. The Pt reacts with a compound semiconductor such as GaAs from a low temperature of about 200° C., to form compounds with each of the component elements of the compound semiconductor. For example, when Pt reacts completely with GaAs, the compounds form a multilayered structure in the order PtGa, PtAs$_2$ and GaAs. So, Ti has functions not only for forming ohmic contact to GaAs layer but for "barria layer" preventing contact of Pt and GaAs. As shown in FIG. 14, a phenomenon occurs in that the thickness of the Ti layer 122, which is the barrier layer, becomes thin on the end section 126 on the opening side of the p-side ring electrode 121 or there is dispersion in the thickness, and there is direct contact between the Pt of the Pt layer with the GaAs of the p+ type contact layer 115, or the Pt passes through the thin section of the Ti layer 122 and reacts with the GaAs of the p+ type contact layer 115.

After the Pt of the Pt layer 123 comes in direct contact with the GaAs of the p+ type contact layer 115, or passes through the thin section of the Ti layer and comes in contact with the GaAs of the p+ type contact layer 115, when heated, the Pt disperses deeply inside the GaAs and forms a protruding section 152, and in this protruding section 152, Pt reacts with GaAs to form the aforementioned compounds.

When the Pt disperses inside the GaAs forming a protruding section 152, and Pt reacts with the GaAs in this way, it causes localized deformation to occur in the p+ type contact layer 115 near the boundary surface between the p+ type contact layer 212 and the p-side ring electrode 121, and with this as a starting point, causes dislocation (defects) to occur inside the semiconductor layers. Dislocation inside the semiconductor layers occurs near the light-emitting section, so problems occur in that the laser characteristics are degraded, and the life of the laser element is affected.

The reaction between the p-side ring electrode 121 and the p+ type contact layer 115 is promoted by being subjected to high temperatures of about 400° C. in the oxidation process by the oxidation constriction film that is performed after formation of the mesapost. Moreover, when As and Pt react, a problem occurs in that a PtAs compound is generated and the resistance of the electrode greatly increases, which causes the laser characteristics and particularly the RF characteristics during high-frequency operation to worsen considerably.

The use of Pt was explained above, however, the formation of compounds of transition metals such as Ni and Pd and the component elements of a compound semiconductor is also known.

Moreover, depending on the operating conditions of the laser, such as high surrounding temperature and driving the laser using a high driving current, there is a possibility due to electromigration that the aforementioned reaction will proceed during laser operation even in cases where at a first glance it appears that the reaction described above will not occur. Especially, the end section 126 on the opening side of the p-side ring electrode 121 is in a location where the current is most easily concentrated, and by adding stress caused by the reaction to this section will particularly cause the degradation to advance when current flows for a long period.

Furthermore, in a surface emitting laser having intra-cavity structure where the upper DBR mirror 150 is formed using a dielectric film, for example, the p-side ring electrode 121 is formed on an upper clad layer (upper graded composition layer 111, p type spacer layer 112, p+ type current path layer 113, p type spacer layer 114 and p+ type contact layer 115), so the distance between the p-side ring electrode 121 and the active layer 106 becomes extremely close, or approximately 1 μm or less, for example. In addition, it becomes easy for deformation to occur at the boundary between the p-side ring electrode 121 on the upper clad layer and the upper DBR mirror 150. Therefore, with this structure, it becomes even easier for the active layer 106 to receive the effect of the degradation of the structure due to a reaction between the p-side ring electrode 121 and the p+ type contact layer 115, which is the very top layer of the upper clad layer, so the problem described above becomes even more prominent.

In the oxidation process of forming the oxidation constriction layer, Ti diffuses into the GaAs of the p+ type contact layer 115, or there is mutual diffusion of the Ti and GaAs of the p+ type contact layer 115, and a material layer 151, which includes Ti and at lease one of the components of GaAs of the p+ type contact layer 115, or in other word, includes Ti and at least one of Ga and As, is formed. This material layer 151 will be described later.

PREFERRED EMBODIMENTS

Next, a surface emitting semiconductor laser element and manufacturing method thereof of preferred embodiments of the present invention will be explained.

A vertical cavity type surface emitting semiconductor laser element (VCSEL: Vertical Cavity Surface Emitting Laser), as its name indicates, is such that the resonating direction of light is vertical with respect to the substrate surface, and is gaining much attention as a light source for communication, such as in optical interconnection, and as a device for various applications such as use in sensors. The reason for this is that when compared with a conventional end surface emitting semiconductor laser, a surface emitting laser has various advantages such as a 2-dimensional array of laser elements can be easily formed, there is no need for cleavage when forming a mirror, so testing is possible on a wafer level, the volume of the active layer is quite small, so oscillation is possible at an extremely low threshold value, and power consumption is small.

Embodiment 1

Figure 1:
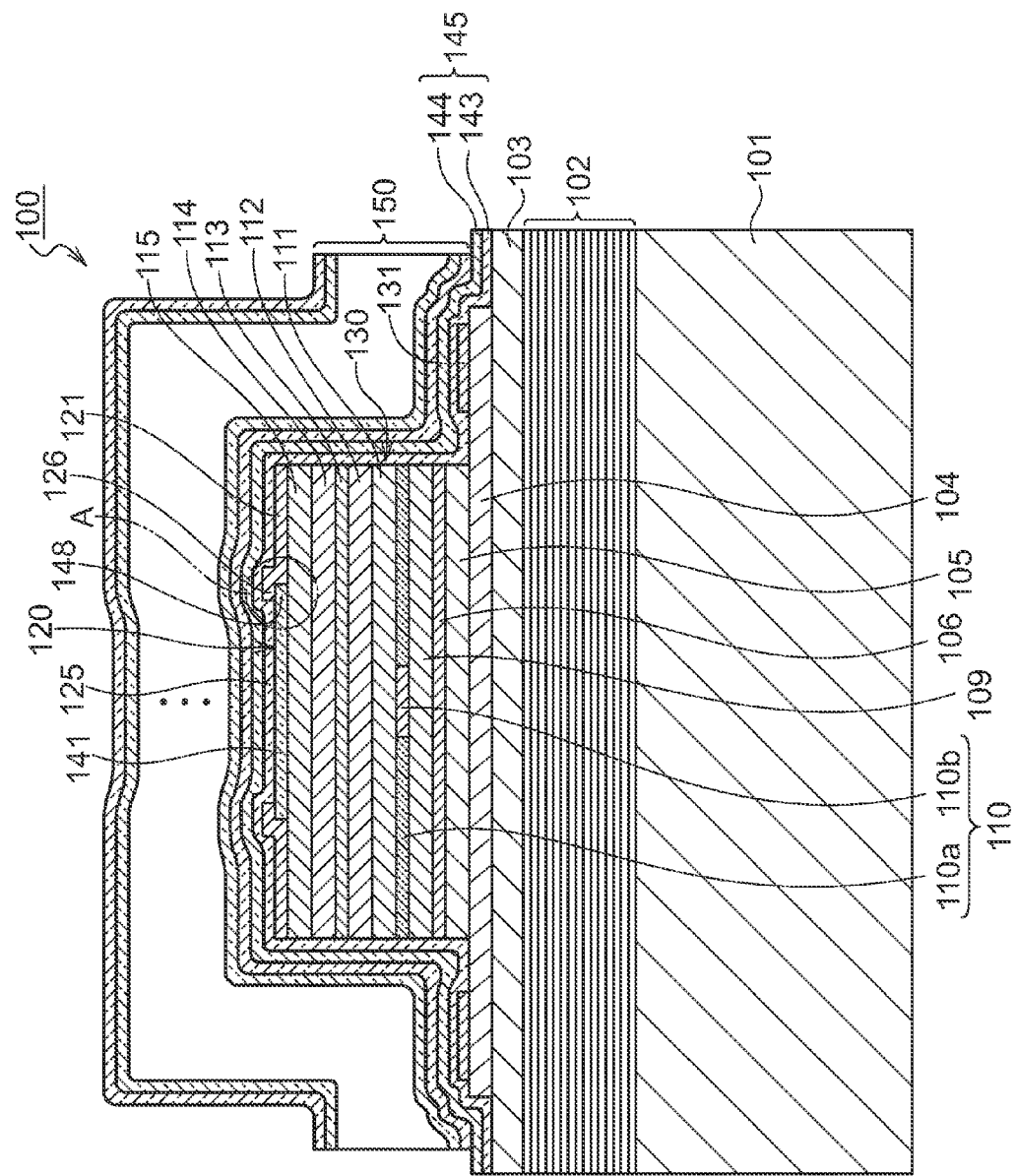
FIG. 1 is a vertical cross-sectional drawing for explaining a surface emitting semiconductor laser element of a first preferred embodiment of the present invention.

Referencing FIG. 1, a surface emitting laser 100 of a first preferred embodiment of the present invention comprises a substrate 101 and a layered structure that is sequentially formed on the substrate 101 that includes a lower DBR 102, a buffer layer 103, an n+ type contact layer 104, an n type spacer layer 105, an active layer 106, a lower graded composition layer 109, a current constriction layer 110, and upper graded composition layer 111, a p type spacer layer 112, a p+ type current path layer 113, a p type spacer layer 114 and a p+ type contact layer 115.

Of the layered structure, at least from the n type spacer 105 to the p+ type contact layer 112 forms a cylindrical shaped mesapost 130. The current constriction layer 110 has a current constriction section 110a that is located on the outer side of the mesapost 130, and a circular current injection section 110b that is located on the inside of the current constriction section 110a.

The substrate is made of undoped GaAs. The lower DBR 102 consists of 34 pairs of GaAs/Al$_{0.9}$Ga$_{0.1}$As layers. The buffer layer 103 is made of n type GaAs. The n+ type contact layer 104 is made of n+ type GaAs doped with an n type dopant such as selenium (Se) or silicone (Si). The n type spacer layer 105 is made of n type GaAs that is doped with an n type dopant. The active layer 106 has a layered structure in which three GaInNAs well layers and four GaAs barrier layers are alternately layered, and where the very bottom GaAs barrier layer has multiple quantum well structure that functions as an n type clad layer. Of the current constriction layer 110, the current constriction section 110a is made of Al$_2$O$_3$, and the current injection section 110b is made of AlAs. The diameter of the current injection section 110b is 5 to 7 μm. The current constriction section 110a restricts the current path of the current that flows between the p-side ring electrode 121 and the n-side electrode 131 so that the flow of current is concentrated at the current injection section 110b, and the current constriction layer 110 functions as a current path restriction layer. The lower DBR 102 can be formed from a dielectric multilayer film.

The lower graded composition layer 109 and upper graded composition layer 111 are made of AlGaAs, and are such that the Al composition gradually increases going toward the current constriction layer 110 as seen from the layered direction. Moreover, the p type spacer layers 112, 114, the p+ type current path layer 113 and the p+ type contact layer 115 are each respectively made of p type or p+ type GaAs that is doped with a p type dopant such as carbon (C), zinc (Zn) or beryllium (Be). The acceptor or donor concentration of each p type or n type layer is about $1\times10^{18}$ cm$^{-3}$, for example, and the acceptor or donor concentration of each p+ type or n+ type layer is $3\times10^{19}$ cm$^{-3}$ or greater.

Figure 5:
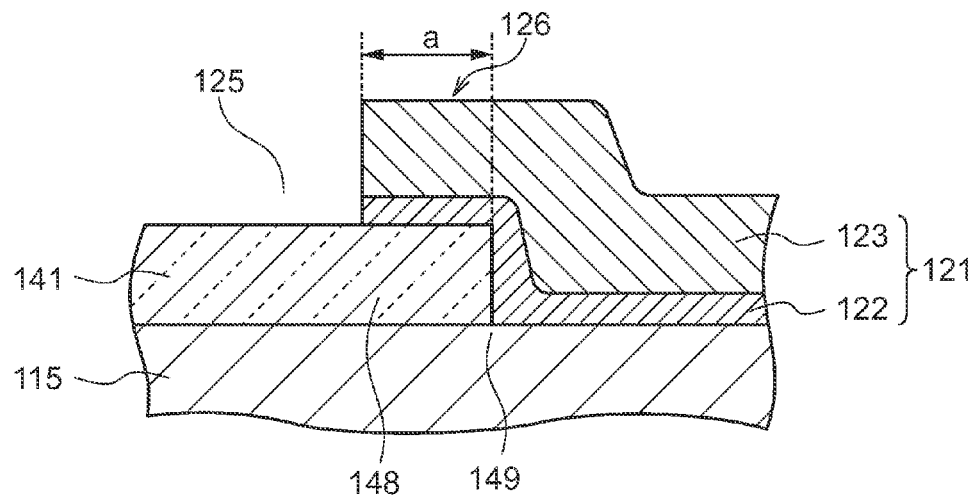
FIG. 5 is a partial enlarged vertical cross-sectional drawing of A in FIG. 1.

The p-side ring electrode 121 is formed on the p+ type contact layer 115. As illustrated in FIG. 5, the p-side ring electrode 121 is made of multilayer structure of Pt/Ti layers having a Pt layer 123 that contributes to electric conductivity, and a Ti layer 122 for improving the adhesion with the p+ type contact layer 115 and for blocking the mutual diffusion of Pt and the semiconductor material (the bottom side is the Ti layer 122 and the top side is the Pt layer 123). The Ti layer 122 has lower reactivity with the p+ type contact layer 115 than the Pt layer 123. The p-side ring electrode 121 has an opening 125 for letting laser light pass through the center, and has an outer circumference that is near the same as the outer circumference of the cylindrical shaped mesapost 130.

A disk shaped dielectric layer 141 made of a material having low reactivity with the Pt of the p-side ring electrode 121, here silicone nitride (SiN$_x$) is used, is formed inside the opening 125 of the p-side ring electrode 121.

In the surface emitting laser, it is necessary for light having a wavelength that will generate a laser to form a standing wave between the upper DBR mirror 150 and the lower DBR mirror 102. This standing wave is such the very top surface of the lower DBR mirror 102 and the very bottom surface of the upper DBR mirror 150 are at the position of the anti-node of the standing wave. As described above, the current constriction layer 110, the p+ type current path layer 113 and the p+ type contact layer 115 are designed with the importance placed on the electrical characteristics, and because a dopant is used, there is a possibility of laser oscillation light being absorbed or dispersed. Therefore, the current constriction layer 110, the p+ type current path layer 113 and the p+ type contact layer 115 are designed so that they are positioned at the nodes of the standing wave of light.

In this embodiment, a dielectric layer 141 is formed on the p+ type contact layer 115 inside the opening 125 of the p-side ring electrode 121. This dielectric layer 141 functions as a phase adjustment layer, called a re-phase layer that adjusts the optical length of the oscillator. The dielectric layer 141 is formed between the p+ type contact layer 115 and the upper DBR mirror 150. The portion from the top surface of this dielectric layer 141 to the bottom surface of the buffer layer 103 forms an oscillator 120.

The p+ type contact layer 115 is designed such that it is located at the nodes of the standing wave, so the dielectric layer 141 is such that the top surface of the dielectric layer 141, or in other words, the very bottom surface of the upper DBR mirror 150 is located at the anti-node of the standing wave, and the optical thickness thereof is adjusted to be about π/4. Here, the optical thickness of a layer is given as the product of the layer thickness and the refractive index of that layer. The thickness of the dielectric layer 141 depends on the oscillation wavelength, and is 100 nm to 180 nm, for example. The outer diameter of the dielectric layer 141 is 5 to 14 μm, for example.

The outer diameter of the p-side ring electrode 121 is, for example, 30 μm. As illustrated in FIG. 5, the film thickness of the p-side ring electrode 121 is greater than the layer thickness of the phase adjustment layer 141, and the end section 126 on the opening side of the p-side ring electrode 121 extends from the p+ type contact layer 115 to the dielectric film 141, with the outer edge section 148 of the dielectric film 141 being covered by a width 'a' of approximately 250 nm. In this embodiment, a multilayered electrode is formed with the film thickness of the Ti layer 122 being 50 nm, and the film thickness of the Pt layer 123 being 200 nm, however, the film thickness of the Ti layer can be selected from the range 10 to 200 nm, and preferably from the range of 10 to 50 nm, and the film thickness of the Pt layer can be adequately set according to the use. Moreover, under typical conditions of vapor deposition or sputtering that are used in the formation of electrodes in this field, from experiments using several suitable barrier materials (Ti, Ta, Mo, Cr), it was found that for a width 'a' of 100 nm to 1 μm, and preferably 250 nm to 1 μm, and more preferably 450 nm to 1 μm, by designing the end section 126 of the opening side of the p-side ring electrode 121 so that it is over the outer edge section 148 of the dielectric film 141, a sufficiently uniform barrier layer (Ti layer 122 in this embodiment) thickness can be obtained at the position of the boundary 149 between the p-side ring electrode 121 and the dielectric film 141.

The upper DBR 150 that is made of multilayered dielectric film is formed from the top of the p-side ring electrode and dielectric layer 141 on the side surface and perimeter of the mesapost 130. The upper DBR 15 is made of 10 to 12 pairs of SiN$_x$/SiO$_2$ layers, for example. Moreover, in order to protect the surface, a passivation film 145 made of SiO$_2$ 143 with SiN$_x$ 144 on top is formed over the entire surface. The SiO$_2$ 143 and SiN$_x$ 144 of this passivation film 145 also function as the very bottom SiO$_2$ and SiN$_x$ layers of the DBR mirror 150. Therefore, the very bottom layer of the upper DBR mirror 150 made of SiN$_x$/SiO$_2$ is the SiO$_2$ layer of the passivation film 145 with the SiN$_x$ layer of the passivation film 145 on top, and on top of that SiO$_2$ and SiN$_x$ are alternately layered, with the very top layer being SiN$_x$. Instead of this, the upper DBR 150 can be formed from a pair of α-Si/SiO$_2$ or α-Si/Al$_2$O$_3$ layers. Here, the number of pairs of layers of the upper DBR mirror 150 and lower BDR mirror 102 is set according to the index of refraction of the material to a number of layers needed to obtain adequate reflectance.

The n+ type contact layer 104 extends to the outside in the radial direction from the lower section of the mesapost 130, and a semi ring-shaped n-side electrode 131 made of AuGeNi/Au (the lower layer is AuGeNi, and the upper layer is Au), for example, is formed on the surface around the base section of the mesapost 130. The n-side electrode 131 has an outer diameter of 90 μm and an inner diameter of 50 μm, for example.

An n-side extractor electrode (not shown in the figure) that is made of Au is formed on the n-side electrode 131 so that it comes in contact with the n-side electrode 131 via an opening (not shown in the figure) that is formed in the passivation film 145. On the other hand, a p-side extractor electrode (not shown in the figure) that is made of Au is formed on the p-side ring electrode 121 so that it comes in contact with the p-side ring electrode 121 via an opening (not shown in the figure) that is formed in the passivation film 145. Furthermore, the n-side extractor electrode and p-side extractor electrode respectively connect the n-side electrode 131 and p-side ring electrode 121 to an externally provided current supply circuit (not shown in the figure).

In the surface emitting laser 100 having the structure described above, voltage is applied between the n-side electrode 131 and p-side ring electrode 121 via the n-side extractor electrode (not shown in the figure) and p-side extractor electrode (not shown in the figure), respectively, and drive current is injected. The injected drive current flows through the low-resistivity p+ type contact layer 115 and p+ type current path layer 113, and the current path is further constricted inside the current injection section 110$b$ by the current constriction layer 110, and current having a high current density is supplied to the active layer 106. Through this current injection, the active layer 106 emits light spontaneously. Of this spontaneously emitted light, light having a wavelength λ, which is the laser oscillation wavelength, forms a standing wave inside the oscillator 120 between the lower DBR mirror 102 and upper DBR mirror 150, and is amplified by the active layer 106. When the injected current exceeds a threshold value, the light that forms the standing wave generates laser light and outputs 1300 nm band laser light upward from the opening 125 of the p-side ring electrode 121.

In this embodiment, the combination of a well layer and barrier layer that form the active layer 106 is GaInNAs (Sb)/GaAs, however a GaInNAs (Sb) well layer and GaNAs (Sb), or depending on the wavelength (the substrate and other layered structure is suitably selected according to the combination of these well and barrier layers), in the case of a 940 to 1200 nm band laser, INGaAs/GaAs or InGaAs/GaAsP, and in the case of a 850 nm band laser, GaAs/AlGaAs can also be selected (the combination of well layer and barrier layer is not limited to these). For the quantum well layer and barrier layer, the quantum well width can be arbitrarily designed and created to correspond with the desired wavelength to be generated.

With this embodiment, the existence of a barrier layer (Ti layer 122) having sufficient thickness, is ensured between the Pt, which is electrode material having reactivity, and the semiconductor layer 115 that reacts with this electrode material, so in the surface emitting laser 100 having the structure described above, by preventing insufficient thickness of the Ti layer 122 of the p-side ring electrode 121 near the boundary 149 between the p-side ring electrode 121 and dielectric layer 141 that is prone to concentration of current from the p-side ring electrode 121, it is possible to prevent or suppress a reaction between the Pt layer 123 of the p-side ring electrode 121 and the lower p+ type contact layer 115 thereof, and it is possible to prevent or suppress the occurrence of uneven deformation in the p+ type contact layer 115. Therefore, regardless of whether or not electromigration occurs, it is possible to prevent or suppress the occurrence of deformation or stress in the area where laser drive current is concentrated, and thus yield when manufacturing the surface emitting laser 100 is improved, and reliability during long-term operation is further increased. Particularly, in the intracavity structure of this embodiment, defects due to Pt entering in the base section of the upper DBR mirror 150, where stress deformation easily occurs between the upper DBR mirror 150 of the mesapost 130 and the layered structure on the substrate side, do not occur, so this embodiment is very effective. Moreover, the end section 126 on the opening side of the p-side ring electrode 121 covers the outer edge section 148 of the dielectric layer 141 that functions as a phase adjustment layer, so etching fluid is prevented from entering through the space between the p-side ring electrode 121 and dielectric layer 141.

The manufacturing method for the surface emitting layer 100 of the embodiment described above is explained below with reference to FIG. 2 to FIG. 4.

Figure 2:
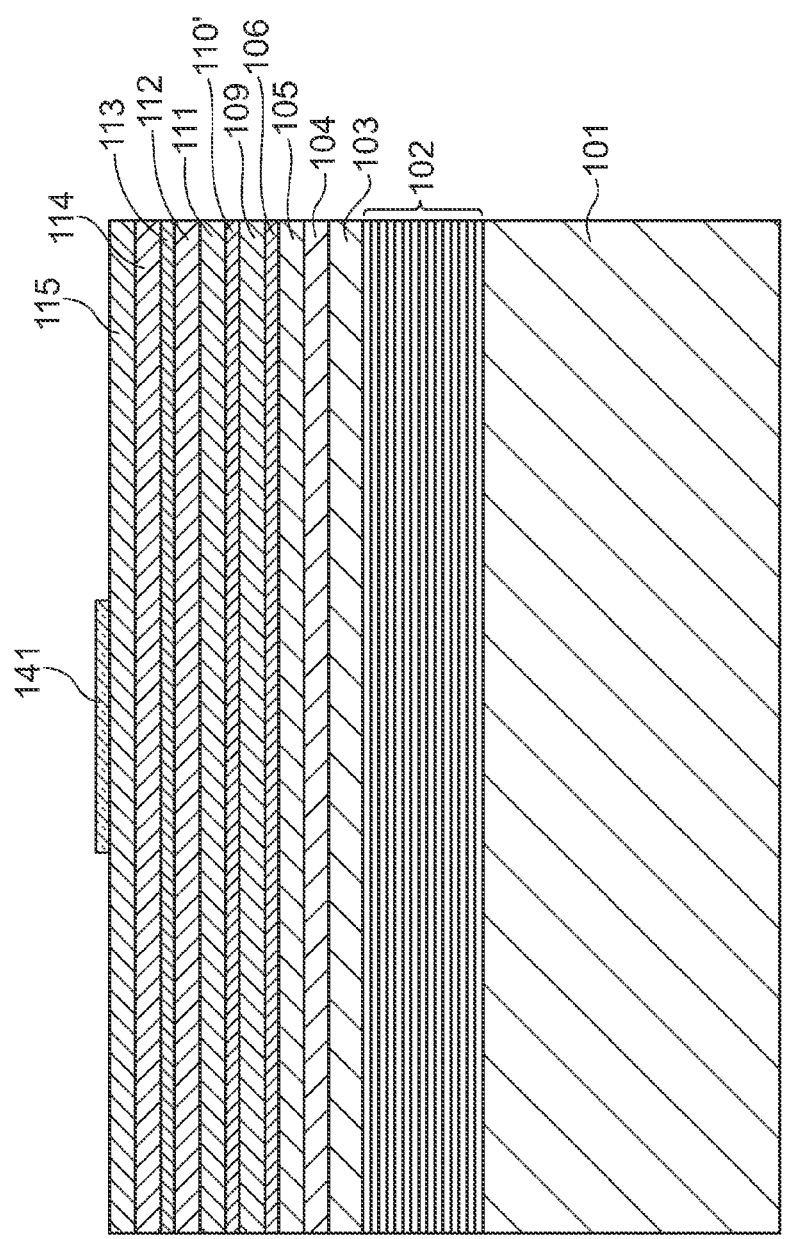
FIG. 2 is a vertical cross-sectional drawing for explaining the manufacturing method of a surface emitting semiconductor laser element of a first preferred embodiment of the present invention.

First, as illustrated in FIG. 2, the lower DBR mirror 102, buffer layer 103, n+ type contact layer 104, n type spacer layer 105, active layer 106, lower graded composition layer 109, AlAs layer 110', upper graded composition layer 111, p type spacer layer 112, p+ type current path layer 113, p type spacer layer 114 and p+ type contact layer are sequentially layered on the substrate 101 by the epitaxial growth method. Next, the disk shaped dielectric layer 141 made of SiN$_x$ is selectively formed in part of the region of the p+ type contact layer 115 using the CVD method and photolithography method.

Figure 3:
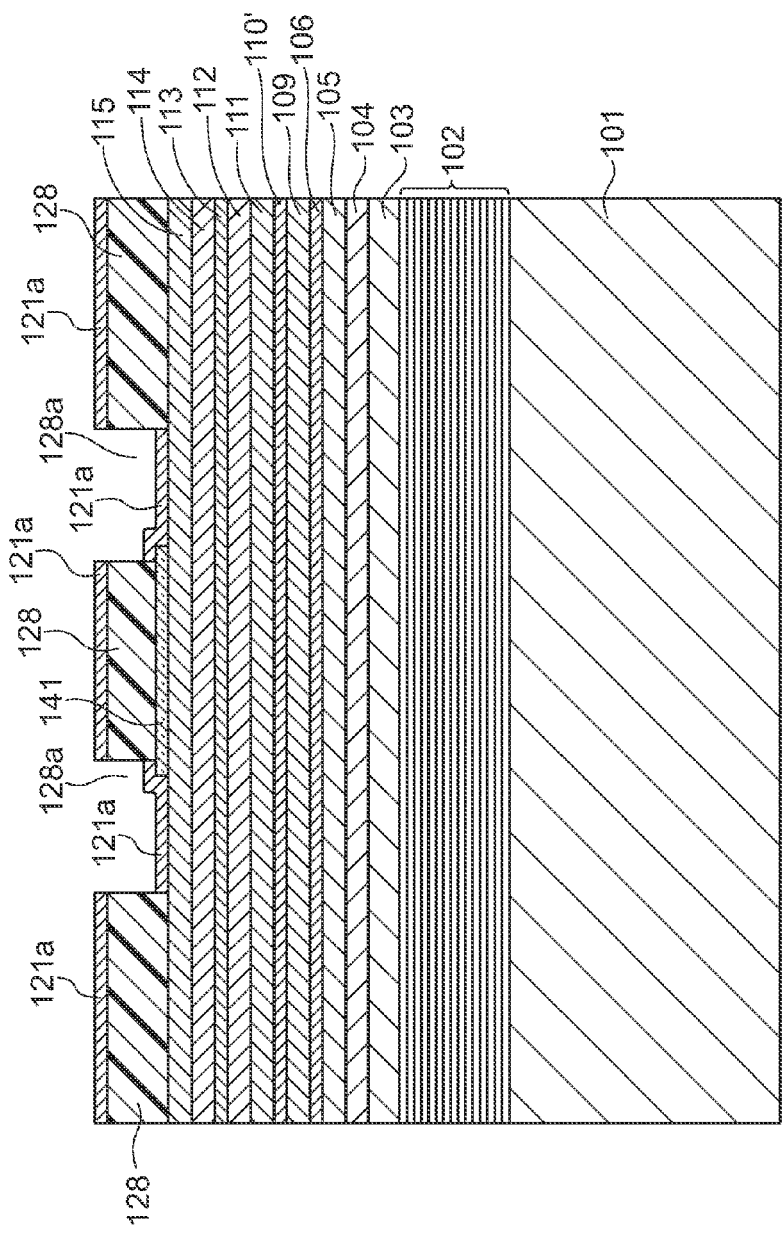
FIG. 3 is a vertical cross-sectional drawing for explaining the manufacturing method of a surface emitting semiconductor laser element of a first preferred embodiment of the present invention.

Next, using a liftoff method, the p-side ring electrode 121 is selectively formed on the p+ type contact layer 115. More specifically, as illustrated in FIG. 3, photoresist 128 is selectively formed inside the area where a part of the outer edge section 148 of the dielectric layer 140 having a width of approximately 250 nm was removed, and in the area where the area around the dielectric layer 141 of the p+ type contact layer 115 having a fixed width was removed, to form a space 128$a$ having the shape of the p-side ring electrode 121. Then, Ti having a thickness of 50 nm is formed by vapor deposition over the entire surface, followed by Pt having a thickness of 200 nm to form a Pt/Ti layer 121$a$, and by removing the photoresist 128, the Pt/Ti layer 121$a$ on the photoresist film 128 is removed, and the Pt/Ti layer 121$a$ that remains in the portion of the space 128$a$ is formed as the p-side ring electrode 121. Through this process, a p-side ring electrode 121 is formed having an end section on the opening side that covers the outer edge section 148 of the dielectric layer 141.

Figure 4:
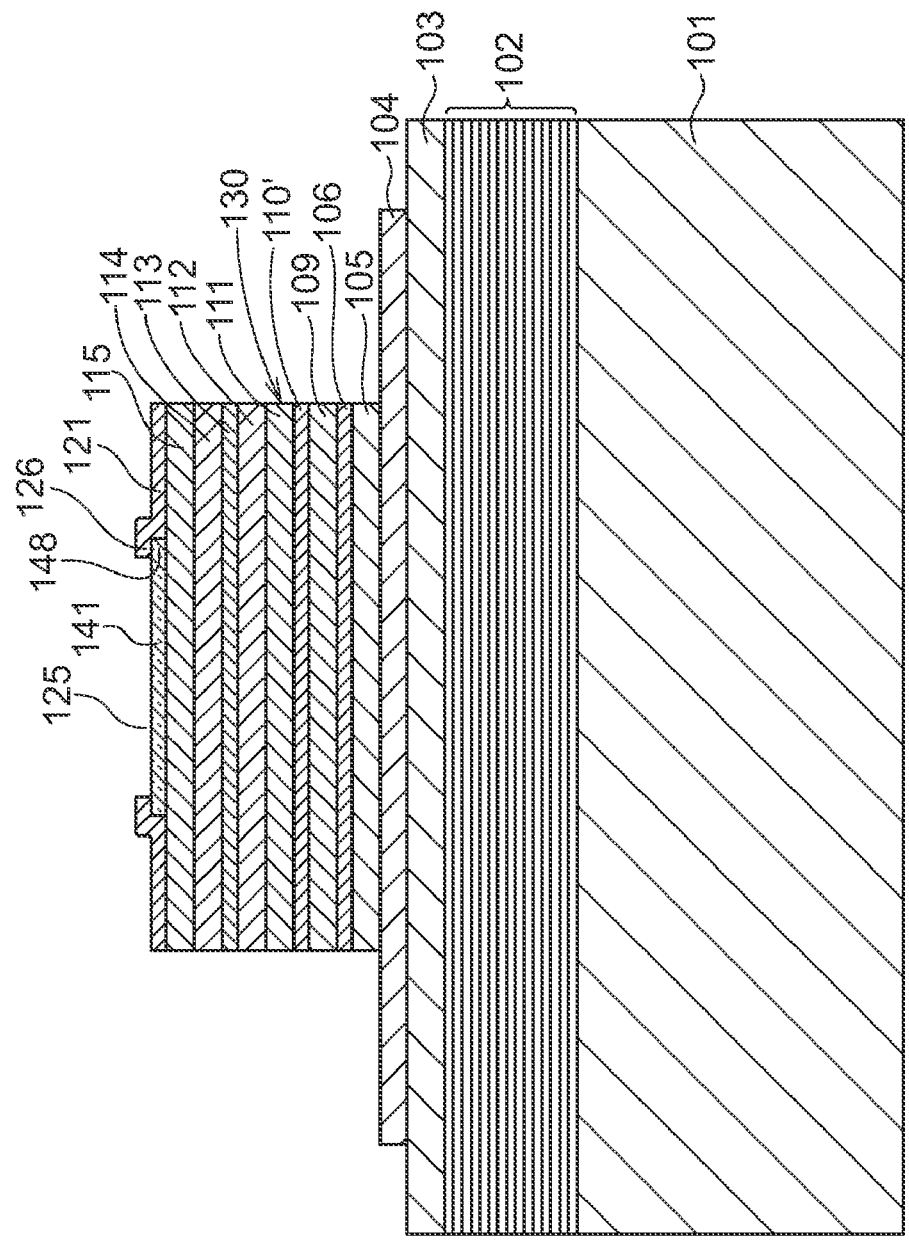
FIG. 4 is a vertical cross-sectional drawing for explaining the manufacturing method of a surface emitting semiconductor laser element of a first preferred embodiment of the present invention.

Next, with the p-side ring electrode as a metal mask, acid etching fluid is used to etch the semiconductor layer to a depth that reaches the n type contact layer 104, to form a cylindrical shaped mesapost 130. After that, a separate mask is formed, and the n type contact layer 104 is etched to a depth that reaches the buffer layer 103. As a result, a mesapost 130 with a shape as illustrated in FIG. 4 is obtained. In these etching processes, the edge section 126 on the opening side of the p-side ring electrode 121 covers the outer edge section 148 of the dielectric layer 141, so the possibility of acid etching fluid penetrating in between the p-side ring electrode 121 and the dielectric layer 141 is eliminated, so the acid etching fluid does not corrode the p+ type contact layer 115 of the p-side ring electrode 121. The mesapost 130 is also self-aligned and formed with the p-side ring electrode 121, so the mesapost 130 can be formed with more precise dimensions.

After that, by performing heat treatment for approximately one hour in a water-vapor atmosphere at approximately 400° C., the AlAs layer 110' is selectively oxidized from the outer side around the mesapost 130, changing the layer to an oxide layer having $Al_2O_3$ as the main component, and the current constriction layer 110a is formed. The chemical reaction proceeds uniformly from the outer side of the AlAs layer 110', so a current injection section 110b made of AlAs remains in the center. The diameter of the current injection section 110b is made to be 5 to 7 μm by adjusting the processing time during selective oxidation. Through this selective oxidation, it is possible to align the center of the mesapost 130, the center of the current injection section 110b and the center of the opening 125 of the p-side ring electrode 121 with high precision.

Figure 12:
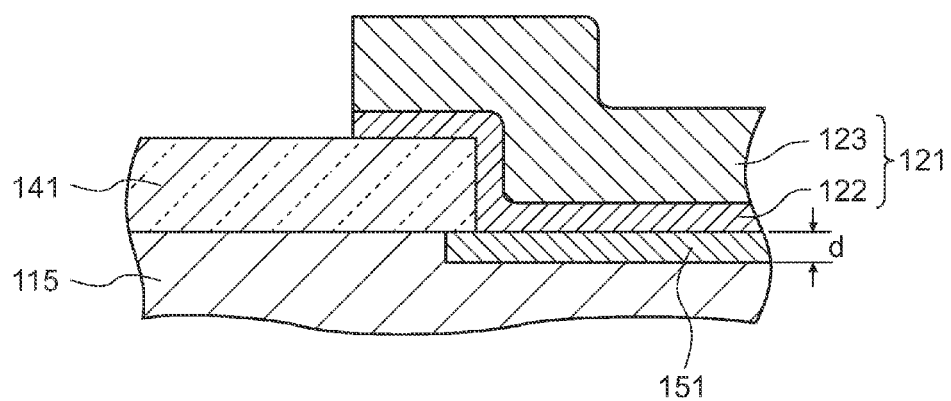
FIG. 12 is a partial enlarged vertical cross-sectional drawing for explaining a surface emitting semiconductor laser element of a first preferred embodiment of the present invention.

As illustrated in FIG. 12, through the heat treatment for the selective oxidation described above, heating during formation of the passivation film 145 and upper DBR 150 to be described later, and the heat generated when driving the laser, Ti, which is one of the component elements (Ti and Pt) of the p-side ring electrode (bottom Ti layer 122, top Pt layer 123), diffuses into the GaAs of the p+ type contact layer 115 at the boundary surface between the p-side ring electrode 121 and GaAs layer of the p+ type contact layer 115, or the Ti and the GaAs of the p+ type contact layer 115 are interdiffused, and a 10 to 60 nm thick material layer 151, which includes Ti and at least one of the components (Ga and As) of the GaAs of the p+ type contact layer 115, is formed.

When the thickness d of this material layer 151 is 10 to 60 nm, it was found that the Ti layer 122 functions as a barrier layer, Pt does not diffuse into the GaAs of the p+ type contact layer 115, and localized deformation of the p+ type contact layer 115 does not occur. However, as illustrated in FIG. 14, when the thickness d of the material layer that is formed on the boundary surface between the p-side ring electrode 121 and the GaAs layer of the p+ type contact layer 115 exceeds 60 nm, Pt, which is one of the component elements (Ti and Pt) of the p-side ring electrode 121, locally penetrates through the Ti layer 122, and at the location of penetration, Pt significantly penetrates into the GaAs layer of the p+ type contact layer 115, and a protrusion section 152 occurs, which causes localized deformation to occur. When the thickness of a material layer, which includes at least one of the component elements (Ti and Pt) of the p-side ring electrode and at least one of the component elements (Ga and As) of the p+ type contact layer 115, is 10 to 60 nm in this way, Pt does not diffuse into the GaAs of the p+ type contact layer 115, and localized deformation does not occur in the p+ type contact layer 115, however, when the thickness exceeds 60 nm, Pt significantly penetrates into the p+ type contact layer 115, which causes localized deformation to occur.

Furthermore, from several experiments by the inventors in which the layer thickness was changed, it was found that a layer that includes Ti having a thickness of 20 nm or greater, and particularly a layer that includes Ti that is a combination of a 10 nm thick or greater Ti layer 122 and 10 nm thick or greater material layer 151, which together having a thickness of 20 nm or greater, can effectively prevent the occurrence of deformation in the p+ type contact layer 115 under the end section 126 on the opening side in the region where the end section 126 on the opening side of the p-side ring electrode 121 comes in contact with the p+ type contact layer 115. In order to prevent the occurrence of new deformation, it is preferred that the thickness of the material layer 151 be 60 nm or greater. The maximum film thickness of the Ti layer 122 can be suitably selected by the user according to the electrode design, however, it should be set to 200 nm or less, and more preferably to 50 nm or less.

After that, as illustrated in FIG. 1, a semi ring-shaped n-side electrode 131 is formed on the surface of the n type contact layer 104 around the outer side of the mesapost 130. Next, after a passivation film 145 is formed over the entire surface by the CVD method, openings (not shown in the figure) are formed in the passivation film 145 over the n-side electrode 131 and p-side ring electrode 121. Furthermore, by way of these openings, an n-side extracting electrode (not shown in the figure) that comes in contact with the n-side electrode 131, and a p-side extracting electrode (not shown in the figure) that comes in contact with the p-side ring electrode 121 are formed.

Next, after the upper DBR 150 made of a dielectric material is formed using the CVD method, the rear surface of the substrate 101 is ground, to adjust the thickness of the substrate 101 to 150 μm, for example. After that, element isolation is performed to complete the surface emitting laser 100 illustrated in FIG. 1.

Moreover, in the embodiment described above, the p-side ring electrode 121 was formed using the liftoff method, however the method for forming the p-side ring electrode is not particularly limited. Also, the dielectric layer 141 formed on the inside of the p-side ring electrode 121 is not necessarily limited to being a phase adjusting layer, and can be a dielectric layer that is inserted underneath the upper DBR for another purpose.

Furthermore, the ring electrode of the mesapost 130 is not limited to a p-side ring electrode, and could also be an n-side ring electrode. In that case, the p side and n side of the semiconductors are switched from that of the construction of this embodiment. In addition, in this embodiment, the end section 126 on the opening side of the p-side ring electrode 121 extends from the top of the p+ type contact layer 115 to the top the dielectric film 141, and covers the outer edge section 148 of the dielectric film 141, however, in an n type electrode as well, when a metal material is used that reacts with the semiconductor layer directly below, similarly, the end section of the n type electrode preferably extends from the top of the semiconductor layer to the top of the dielectric film, and covers the outer edge section of the dielectric film.
(First Variation)

Figure 6:
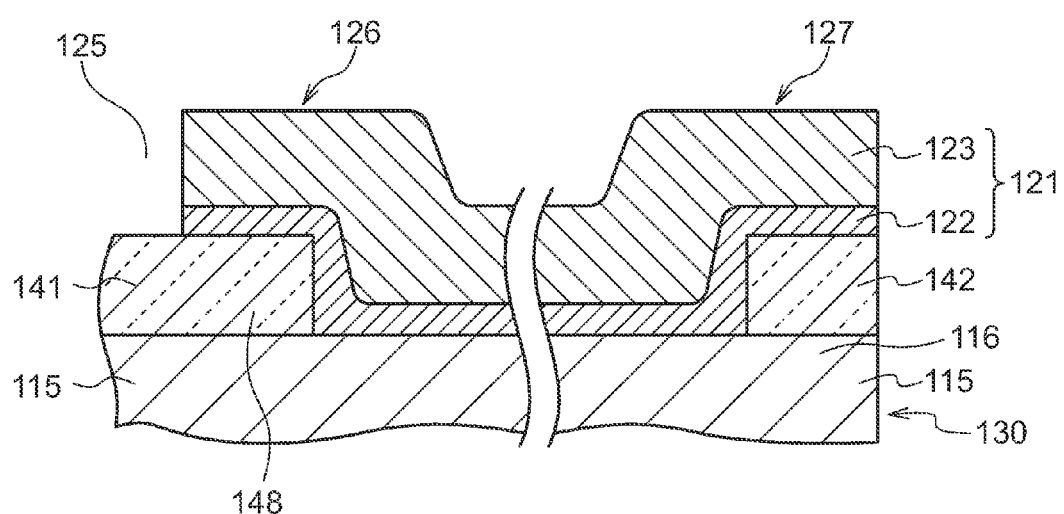
FIG. 6 is a partial enlarged vertical cross-sectional drawing for explaining a variation of a surface emitting semiconductor laser element of a first preferred embodiment of the present invention.

As illustrated in FIG. 6, when manufacturing the dielectric layer 141 that will be a phase adjusting layer, a dielectric layer 142 made of $SiN_x$ is left over the portion that will become the outer edge section of the mesapost 130, or in other words, over the end section 116 on the outside of the p+ contact layer 115, and when forming the photoresist 128 shown in FIG. 3, the photoresist 128 can be formed so that this dielectric layer 142 is exposed, and the end section 126 on the opening side on the inside of the p-side ring electrode that is formed extends from the top of the p+ type contact layer 115 to the top of the dielectric film 141 and over the outer edge section 148 of the dielectric film 141 such that it covers the outer edge section 148 of the dielectric film 141, and the outside end section 127 can be formed such that it extends from the top of the p+ type contact layer 115 to the top of the dielectric film 142 and over the dielectric film 142 to cover the dielectric film 142. In this way, the Pt of the Pt layer of the end section 126 on the opening side on the inside of the p-side ring electrode 121 and the outside end section 127 can be prevented from coming in contact with the GaAs of the p+ type contact layer 115, and thus the occurrence of deformation in the p+ type contact layer 115 can be prevented. In a semiconductor laser having mesapost structure, structural defects not only near the light emitting section, but also near the outer perimeter of the mesapost have an effect on reliability, so providing a structure that also covers this electrode on the outer perimeter of the mesapost is effective. Particularly, this effect is remarkable for a laser having a 1 μm band or less oscillation wavelength.

(Second to Sixth Variations

In the variations described below, the structure of the boundary area between the outer edge section 148 of the dielectric layer 141 and the end section 126 on the opening side of the p-side ring electrode 121 is explained. The structure of parts not shown in the figures can be the same as that of the embodiment described above, but is not limited to that.

(Second Variation)

Figure 7:
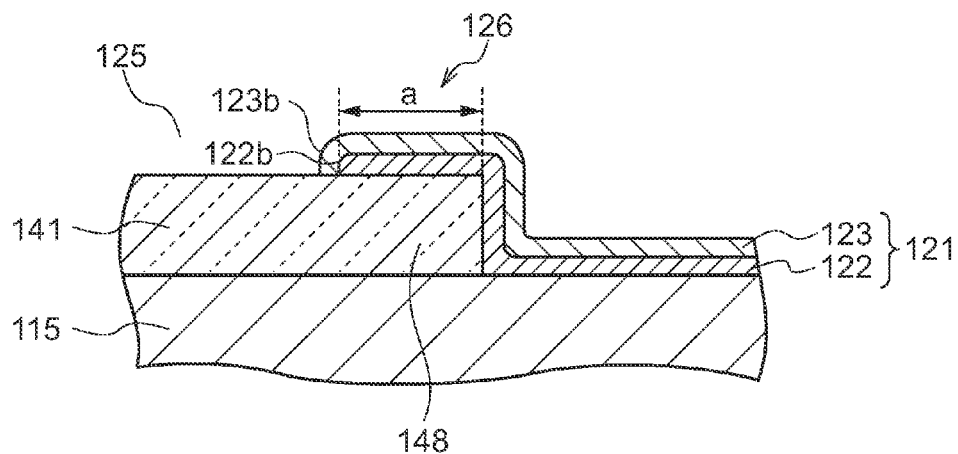
FIG. 7 is a partial enlarged vertical cross-sectional drawing for explaining another variation of a surface emitting semiconductor laser element of a first preferred embodiment of the present invention.

FIG. 7 is an example of the structure when the film thickness of the p-side ring electrode 121 is less than the layer thickness of the dielectric layer 141. In this example, on the outer edge section 148 of the dielectric layer 141, the end section 126 on the opening side of the p-side ring electrode 121, which comprises a bottom Ti layer 122 and top Pt layer 123 that are layered in that order from the boundary surface with the p+ type contact layer 115, extends from the top of the p+ type contact layer 115 to the top of the dielectric film 141, and extends over the outer edge section 148 of the dielectric layer 141 to cover the outer edge section 148 of the dielectric film 141. This can prevent the Pt of the Pt layer 123 of the end section 126 on the opening side on the inside of the p-side ring electrode 121 from coming in contact with the p+ type contact layer 115, and can prevent deformation from occurring in the p+ type contact layer 115. The bottom Ti layer 122 covers the top of the outer edge section 148 of the dielectric film 141 by a width 'a' that is 150 nm or greater. The end 123b on the opening side of the Pt layer covers the end 122b on the opening side of the Ti layer 122, so that the end 122b on the opening side of the Ti layer 122 is not exposed to the opening 125. Therefore, for example, it is possible to prevent or suppress oxidation of the Ti layer 122 in the oxidation process when forming the oxidation constriction layer, and it is possible to prevent or suppress an increase in resistance and changes in structure of the Ti layer 122.

(Third Variation)

Figure 8:
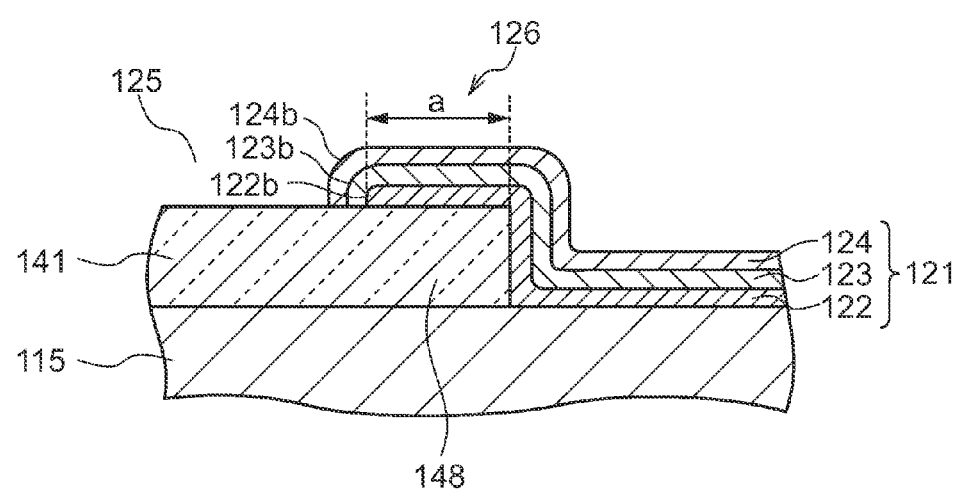
FIG. 8 is a partial enlarged vertical cross-sectional drawing for explaining yet another variation of a surface emitting semiconductor laser element of a first preferred embodiment of the present invention.

FIG. 8 is an example of structure in which the p-side ring electrode comprises three layers a very bottom Ti layer 122, a Pt layer 123 above that, and a very top Au layer 124. In this example, on the outer edge section 148 of the dielectric layer 141, the end section 126 on the opening side of the p-side ring electrode made of multiple metal layers Ti/Pt/Au extends from the top of the p+ type contact layer 115 to the top of the dielectric film 141, and extends over the outer edge section 148 of the dielectric film 141 to cover the outer edge section 148 of the dielectric film 141. This can prevent the Pt of the Pt layer 123 and the Au of the Au layer 124 on the end section 126 on the opening side on the inside of the p-side ring electrode 121 from coming in contact with the p+ type contact layer 115, and can prevent deformation from occurring in the p+ type contact layer 115. The bottom Ti layer 122 covers the outer edge section 148 of the dielectric film 141 by a width 'a' that is 150 nm or greater. The end 123b on the opening side of the Pt layer 123 and the end 124b on the opening side of the Au layer 124 cover the end 122b on the opening side of the Ti layer 122, so the end 122b on the opening side of the Ti layer 122 is not exposed to the opening 125. Therefore, for example, it is possible to prevent or suppress oxidation of the Ti layer 122 in the oxidation process when forming the oxidation constriction layer, and it is possible to prevent or suppress an increase in resistance and changes in structure of the Ti layer 122.

In this variation, the p+ type contact layer 115 comprises three layers, a Ti layer 122, Pt layer 123 and Au layer 124, that are layered in that order from the boundary surface with the p+ type contact layer 115, however, the materials are not limited to these, and instead of the Pt layer 123, a layer made of any one of Au, Ni, Pd and Ge can be used, and instead of the Au layer 124, a layer made of any one of Pt, Ni, Pd, Ti and Ge can be used. Moreover, the number of layers can also be a plurality of layers such as the four layers Ti, Pt, Au, Pt that are layered in that order from the boundary surface with the p+ type contact layer 115.

(Fourth Variation)

Figure 9:
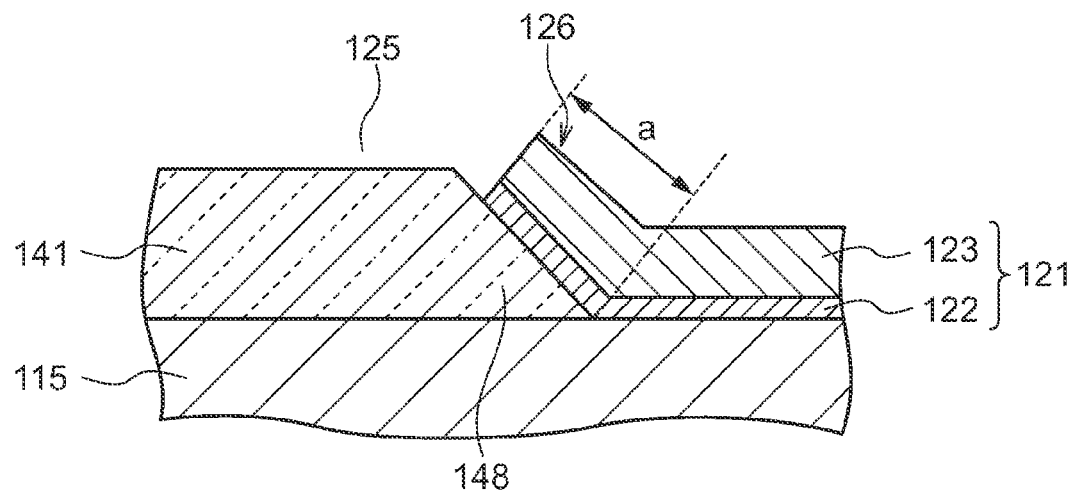
FIG. 9 is a partial enlarged vertical cross-sectional drawing for explaining yet another variation of a surface emitting semiconductor laser element of a first preferred embodiment of the present invention.

FIG. 9 is an example of structure in which the outer edge section 148 of the dielectric layer 141 is inclined. The outer edge section 148 of the dielectric layer 141 has a tapered shape, and the top surface of the outer edge section 148 of the dielectric layer 141 separates from the p+ type contact layer 115 going from the outside toward the inside of the dielectric layer 141. The end section 126 on the opening side of the p-side ring electrode 121 extends from the top of the p+ type contact layer 115 to the top of the dielectric layer 141, and extends over the outer edge section 148 of the dielectric film 141 to cover the outer edge section 148 of the dielectric film 141. This can prevent the Pt of the Pt layer 123 of the end section 126 on the opening side on the inside of the p-side ring electrode 121 from coming in contact with the p+ type contact layer 115, and can prevent deformation from occurring in the p+ type contact layer 115. The bottom Ti layer 122 covers the outer edge section 148 of the dielectric film 141 by a width 'a' that is 150 nm or greater.

With the structure of this variation, there is no unevenness in the p-side ring electrode 121 at the outer edge section 148 of the dielectric layer 141, so it is difficult for discontinuity to occur in the p-side ring electrode 121, and the thickness of the barrier layer (Ti layer 122) during deposition can be relatively thin; for example, even with a thickness of 20 nm, it is possible to maintain a relatively uniform and sufficient thickness at the outer edge section 148 of the dielectric layer 141. In addition, this variation is particularly convenient, because unevenness does not occur at the boundary section when the thickness of the dielectric layer 141 exceeds 120 nm.

By tapering the outer edge section 148 of the dielectric layer 141, forming the dielectric layer 141 such that is has a trapezoidal cross section, and further forming the end section 126 on the opening side of the p-side ring electrode 121 such that it terminates on top of the tapered outer end section 148, the height of the apex of the end section 126 on the opening side of the p-side ring electrode 121 is suppressed, so it is possible to improve the flatness of the layered structure that is formed on top thereof. In an intracavity structure, an upper DBR is used in the layered structure, so this flatness is useful in bringing about uniform reflectivity at the opening section. Moreover, by using a layer having this shape, confinement in the horizontal direction of the laser can practically be made more narrow than the opening section that is formed using an electrode, and by adequately designing the slope angle of the trapezoidal shape, the desired beam diameter and oscillation mode can be controlled.

Fifth Embodiment

Figure 10:
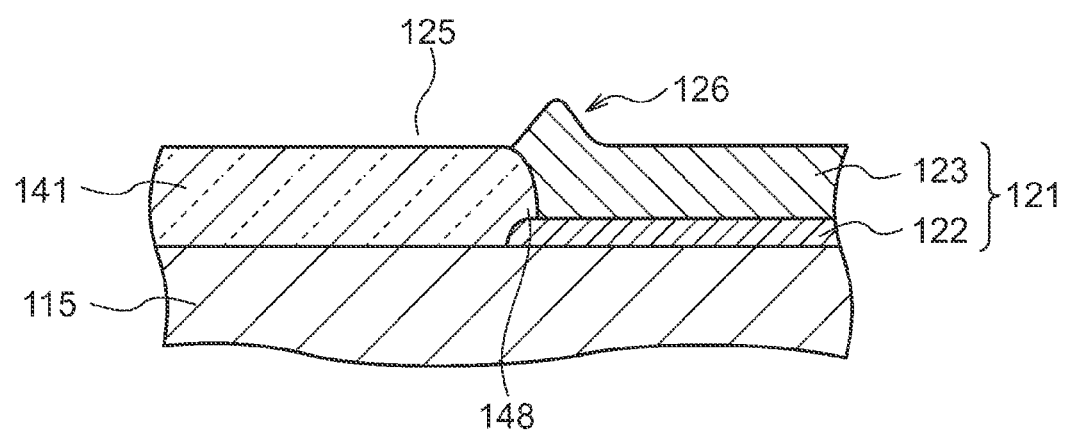
FIG. 10 is a partial enlarged vertical cross-sectional drawing for explaining yet another variation of a surface emitting semiconductor laser element of a first preferred embodiment of the present invention.

FIG. 10 is an example of structure in which the dielectric layer 141 protrudes into the p-side ring electrode 121. The outer edge section 148 of the dielectric layer 141 is located between the end section of the Ti layer 122 and the Pt layer 123 of the p-side ring electrode 121 at the end section 126 on the opening side of the p-side ring electrode 121. This structure is formed by forming a layer (Ti layer 122) on the bottom side of the p-side ring electrode 121 around the dielectric layer 141, and then annealing the end section of the dielectric layer 141, and further depositing the remaining metal layer (Pt layer 123). With this structure as well, a dielectric layer 141 or Ti layer 122 having sufficient film thickness is located between the Pt that reacts with the semiconductor layer of the p+ type contact layer 115 and the p+ type contact layer 115, so the Pt of the Pt layer 123 at the end section 126 on the opening side of the p-side ring electrode 121 can be prevented from coming in contact with the p+ type contact layer 115, and deformation can be prevented from occurring in the p+ type contact layer 115.

(Sixth Variation)

Figure 11:
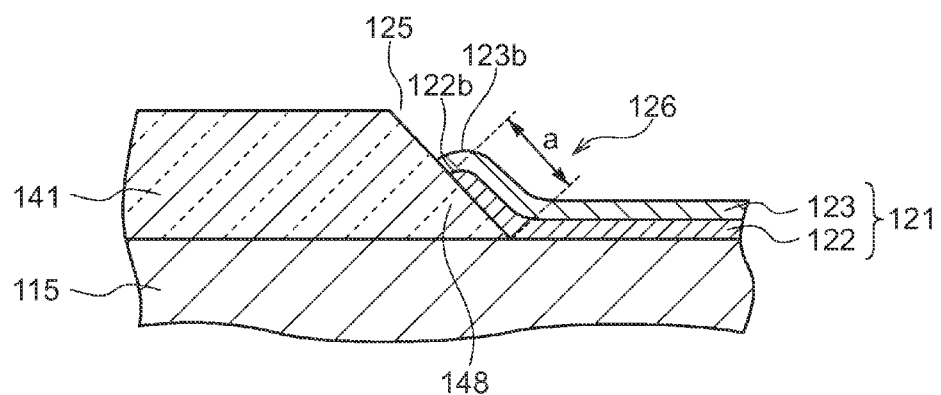
FIG. 11 is a partial enlarged vertical cross-sectional drawing for explaining yet another variation of a surface emitting semiconductor laser element of a first preferred embodiment of the present invention.

FIG. 11 is an example in which the outer end section 148 of the dielectric layer 141 is tapered, the bottom Ti layer 122 terminates part way up the tapered slope, and the top Pt layer 123 covers the end section of the Ti layer 122 and terminates on the slope. The outer end section 148 of the dielectric layer 141 is tapered such that the top surface of the outer end section 148 of the dielectric layer 141 separates from the p+ type contact layer 115 going from the outside toward the inside of the dielectric layer 141. The end section 126 on the opening side of the p-side ring electrode 121 extends from the top of the p+ type contact layer 115 to the top of the dielectric film 141, and extends over the outer edge section 148 of the dielectric film 141 to cover the outer edge section 148 of the dielectric film 141. This can prevent the Pt of the Pt layer 123 of the end section 126 on the opening side on the inside of the p-side ring electrode 121 from coming in contact with the p+ type contact layer 115, and can prevent deformation from occurring in the p+ type contact layer 115. The bottom Ti layer 122 covers the outer edge section 148 of the dielectric film 141 by a width 'a' that is 150 nm or greater.

The end section 126 on the opening side of the p-side ring electrode 121 terminates on the tapered outer edge section 148. The end 123b on the opening side of the Pt layer 123 covers the end 122b on the opening side of the Ti layer 122, so the end 122b on the opening side of the Ti layer 122 is not exposed to the opening 125. Therefore, for example, it is possible to prevent or suppress oxidation of the Ti layer 122 in the oxidation process when forming the oxidation constriction layer, and it is possible to prevent or suppress an increase in resistance and changes in structure of the Ti layer 122.

In all of the variations, as long as the p-side ring electrode 121 rides up onto the outer edge section 148 of the dielectric layer 141 enough that the emission of light in the desired mode is not significantly affected, the Pt of the Pt layer 123 of the end section 126 on the opening side of the p-side ring electrode 121 can be prevented from coming into contact with the p+ type contact layer 115, and deformation can be prevented from occurring in the p+ type contact layer 115, however, preferably, the p-side ring electrode 121 will ride up over the end of the dielectric layer 141 in a range from 100 nm to 1 μm. Moreover, it is most preferred that all of the layers of the multilayered electrode ride up on the dielectric layer 141, however, even in a structure where only a specified amount of a barrier layer (Ti layer 122) of the electrode layers rides up on the dielectric layer 141, a sufficiently uniform barrier layer is obtained at the boundary section between the p-side ring electrode 121 and the dielectric layer 141, so the reactive metal Pt of the p-side ring electrode 121 can be prevented from coming into contact with the p+ type contact layer, and localized deformation can be prevented from occurring in the p+ type contact layer 115.

Embodiment 2

Figure 15:
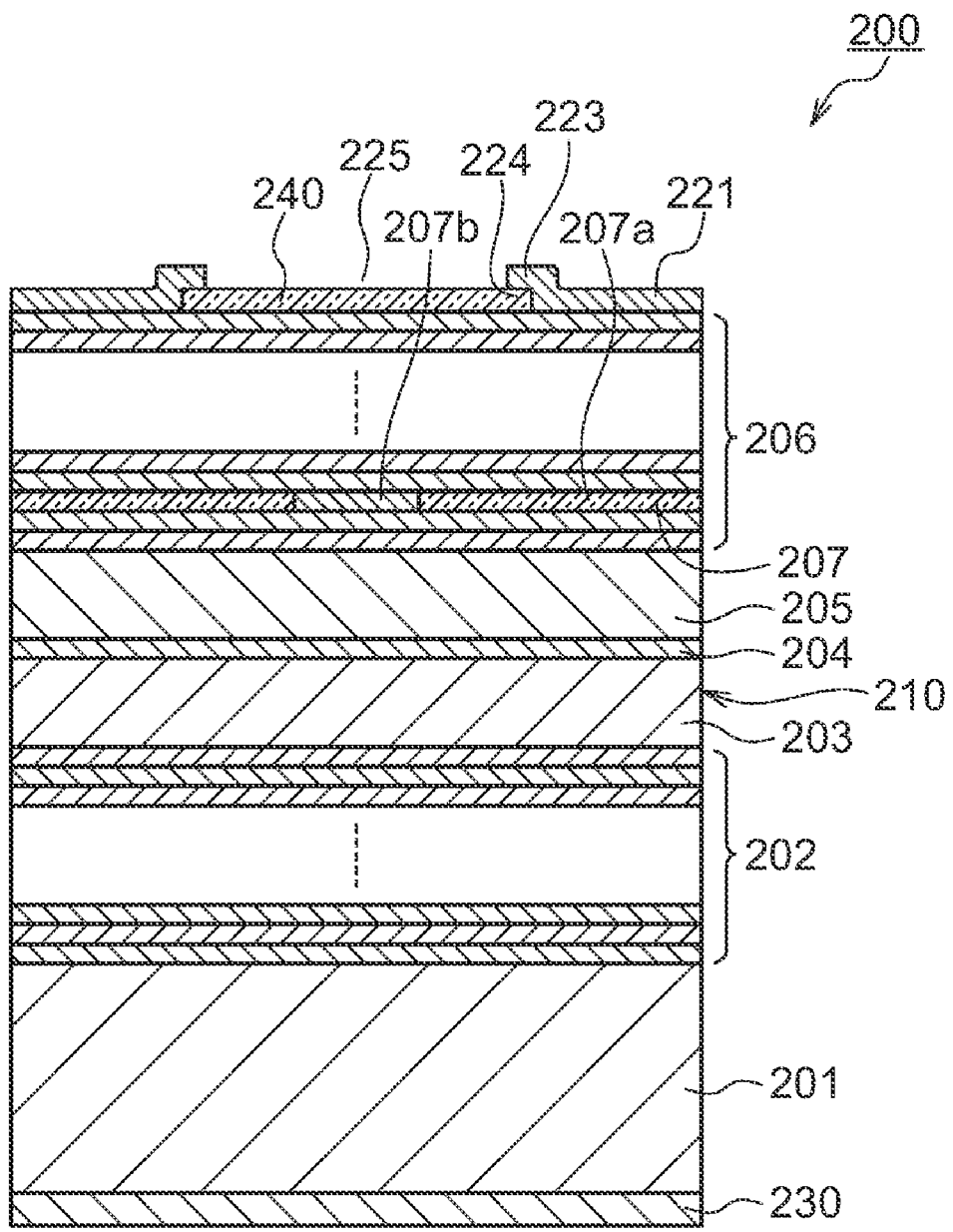
FIG. 15 is a vertical cross-sectional drawing for explaining a surface emitting semiconductor laser element of a second preferred embodiment of the present invention.

Next, a semiconductor laser element 200 of a second embodiment of the present invention is explained with reference to FIG. 15. The surface emitting laser 200 of this embodiment comprises: an n-side electrode 230, an n type semiconductor substrate 201, a lower semiconductor DBR mirror 202, an n type clad layer 203, an active layer 204 having quantum well structure 204, a p type clad layer 205, an upper semiconductor DBR mirror 206, an oxidation current constriction layer 207 having a current constriction section 207a and a current injection section 207b, a p-side ring electrode 221, and a protective layer 240. The n type clad layer 203, active layer 204 and p type clad layer 205 form an oscillator 210. One layer of the upper semiconductor DBR mirror on the side near the active layer 204 is the current constriction layer 207 having a current constriction section 207a located around the outside and a current injection section 207b that is located in the center of the current constriction section 207a.

The substrate 201 is made of n-GaAs. Also, the lower DBR mirror 202 is made of 35 pairs of n-$Al_{0.9}Ga_{0.1}As$/n-$Al_{0.2}Ga_{0.8}As$ with each layer having a thickness $\lambda/4n$ ($\lambda$ is the oscillation wavelength and n is the refraction index). The n type clad layer 203 is made of n-$Al_{0.4}Ga_{0.6}As$. The active layer 204 has quantum well structure and is made of a GaAs well layer and an $Al_{0.2}Ga_{0.8}As$ barrier layer. The p type clad layer 205 is made of p-$Al_{0.4}Ga_{0.6}As$.

The upper semiconductor DBR mirror 206 is made of 25 pairs of p-$Al_{0.9}Ga_{0.1}As$/p-$Al_{0.2}Ga_{0.8}As$ with each layer having a thickness $\lambda/4n$ ($\lambda$ is the oscillation wavelength and n is the refraction index). One layer of the upper semiconductor DBR mirror 206 on the side close to the active layer 204 is formed of an AlAs layer instead of an $Al_{0.9}Ga_{0.1}As$, where the AlAs of the perimeter region is selectively oxidized to become the current constriction section 207a made of $Al_2O_3$.

A ring shaped p-side ring electrode 221 is provided on the top surface of the upper semiconductor DBR mirror 206. The p-side ring electrode 221 is made, for example, from Ti/Pt (the lower layer being a Ti layer and the upper layer being a Pt layer). The n-side electrode 230 on the bottom surface of the substrate 201 is made, for example, from AuGeNi/Au (the upper layer being an AuGeNi layer, and the lower layer being an Au layer). A dielectric protective layer 240 made of $SiN_x$ is provided on the top surface of the upper semiconductor DBR mirror 206 inside the opening 225 of the p-side ring electrode 221.

The end section 223 on the opening side of the p-side ring electrode 221 extends from the top of the upper semiconductor DBR mirror 206 to the top of the protective layer 240, extends over the top of the outer edge section 242 of the protective layer 240 and covers the outer edge section 242 of the protective layer 240. In this way, the protective layer 240 is located between the end section 223 on the opening side of the p-side ring electrode 221 and the semiconductor layer of the upper semiconductor DBR mirror 206, so it is possible to avoid a reaction between metal such as the Pt of the p-side ring electrode 221 and the semiconductor layer of the upper semiconductor DBR mirror 206.

In a surface emitting laser element having a current constriction layer, the current density in the end section on the opening side of the upper electrode is large, so the surface emitting laser element is very effective in improving reliability by being able to avoid damage in the end section. In the case of a surface emitting layer having an electrode (contact layer) inside or near the oscillator, a phase adjustment layer or part of the mirror can also function as a protective layer, which is advantageous in that there is no need to provide a new protective layer.

In the embodiments described above, the explanation was centered on an electrode made of Ti/Pt as the most preferred combination of electrode layers from the aspect of reactivity and general versatility, however, even though the use of Ti as the metal of the underlayer (barrier layer) located on the boundary surface with the semiconductor layer is most preferred, it is also possible to use an electrode layer made of Ti, W, Mo, TiN, Ta, TaN, Cr or a combination of these as the underlayer (barrier layer), and even though the use of Pt as a metal used in combination with the metal underlayer and located as the top layer is most preferred, it is also possible to use an electrode layer made of a plurality of metals selected from Pt, Au, Ni, Pd, Ge or combination of these as the top layer.

It is particularly preferred that the metal underlayer be selected from a metal that does not allow a metal that reacts with the semiconductor layer to pass through.

It is also particularly preferred that the metal underlayer be selected from a metal that does not allow the atoms (especially Au) of the semiconductor layer to pass through.

It is particularly preferred that the dielectric layer be selected from a material that does not allow atoms from a metal electrode or semiconductor to pass through. Moreover, it is particularly preferred that the dielectric layer be selected from a material that does not react with a metal electrode or semiconductor.

In the embodiments described above, a surface emitting layer, and particularly an intracavity type layer was explained as being most preferable, however, application of the present invention is not limited to a laser, and it is possible to suitably apply the invention to light emitting elements, for example a surface emitting LED that has an electrode having an opening section through which light passes.

Figure 16:
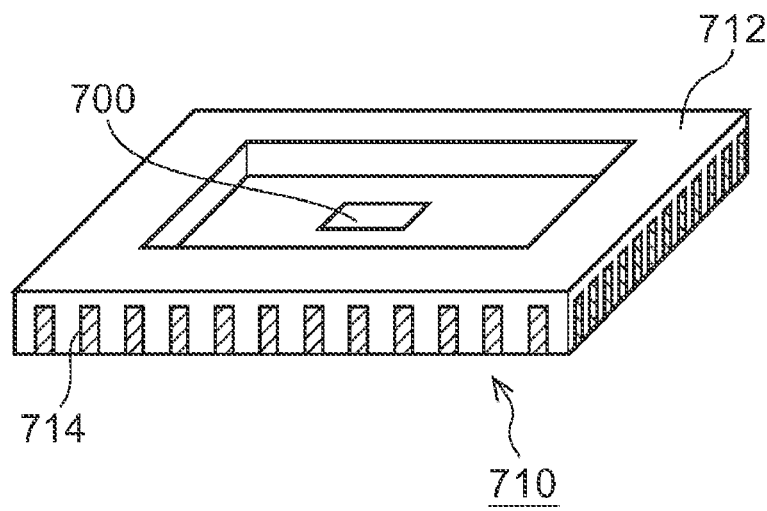
FIG. 16 is a perspective drawing for explaining a surface emitting laser array using a plurality of surface emitting semiconductor laser elements of the first and second preferred embodiments of the present invention.
Figure 17:
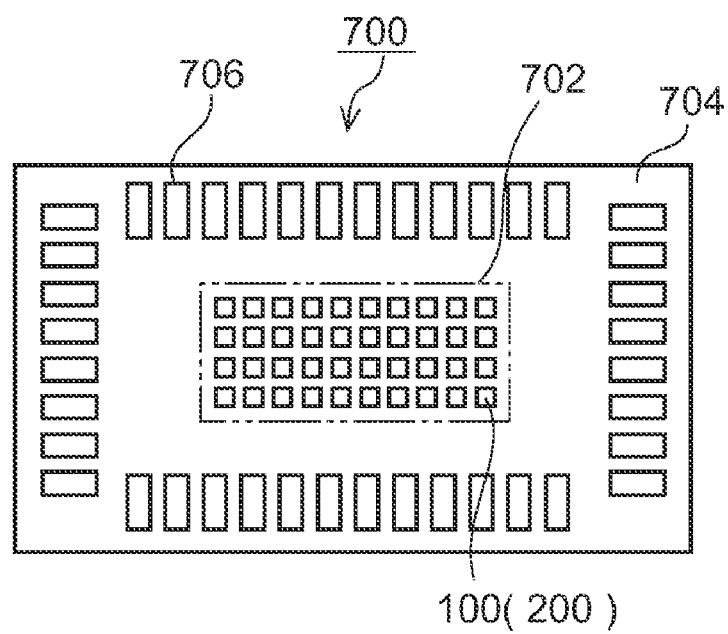
FIG. 17 is a top view for explaining a surface emitting laser array chip that uses a plurality of surface emitting semiconductor laser elements of the first and second preferred embodiments of the present invention.

Next, an example of a surface emitting laser array that uses a plurality of surface emitting semiconductor laser elements 100, 200 of a preferred embodiment of the present invention will be explained with reference to FIGS. 16 and 17. As shown in FIG. 16, a surface emitting laser array is used as an example in which a surface emitting laser array chip 700 is mounted into a known flat package 710 called a CLCC (Ceramic Leaded Chip Carrier). In the figure, in order to avoid complication, the connection between a metal caster (electrode) 714 and the surface emitting laser array chip 700 is omitted. As shown in FIG. 17, the surface emitting laser array chip 700 has an element section 702 comprising a plurality of surface emitting semiconductor laser elements 100 (200) that are provided in the center thereof, and a plurality of electron pads 706 are provided around the perimeter and that are connected to a plurality of light emitting sections (not shown in the figure) of the element section 702. Furthermore, each electrode pad 706 is connected to the metal caster 714 (not shown in the figure) of the flat package 712. The light emission of each light emitting section is controlled by an external control circuit (not shown in the figure) that is connected to the flat package 712, and each light emitting section emits a laser light having a specified wavelength.

Figure 18:
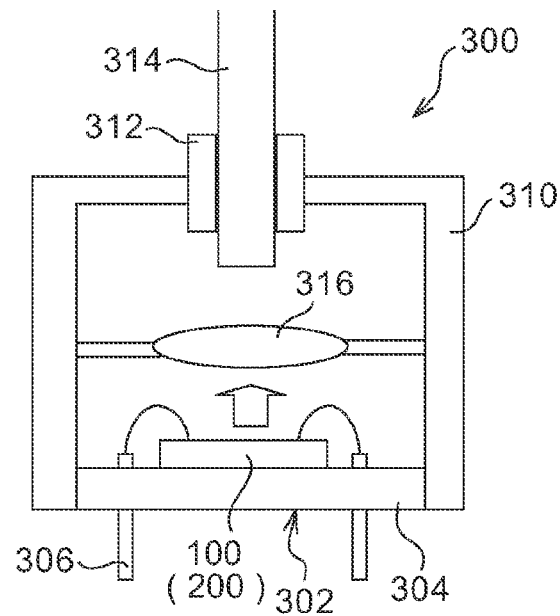
FIG. 18 is a vertical cross-sectional drawing for explaining a surface emitting package that uses a surface emitting semiconductor laser element of the first and second preferred embodiments of the present invention.

Next, an example of applying the surface emitting semiconductor laser elements 100, 200 of a preferred embodiment of the present invention to an optical device is explained with reference to the drawings. FIG. 18 is a vertical cross-sectional drawing of construction when the surface emitting semiconductor laser element 100, 200 of the preferred embodiment of the present invention described above is applied to a package of light emitting elements. A light emitting laser package 300 comprises: a laser module, which includes a surface emitting semiconductor laser element 100, 200, a substrate 304 and an electrode 306, a lens 316, a housing 310, an optic fiber mount 312 and optic fiber 314. The electrode 306 is electrically connected to an external control circuit (not shown in the figure), and controls the light emission of the surface emitting laser package. The laser light that is emitted from the surface emitting semiconductor laser element 100, 200 is collected by the lens 316 and is optically coupled with the optic fiber 314.

Figure 19:
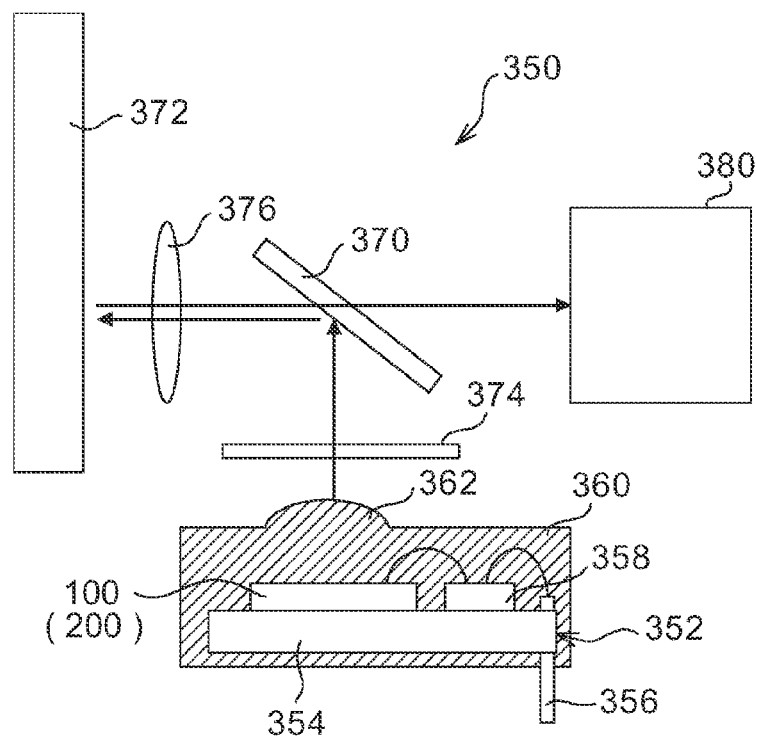
FIG. 19 is a vertical cross-sectional drawing for explaining a pickup for an optical disk that uses a surface emitting semiconductor laser element of the first and second preferred embodiments of the present invention.

FIG. 19 is a vertical cross-sectional drawing of construction when the surface emitting semiconductor layer element 100, 200 of the preferred embodiment of the present invention described above is applied to the pickup of a read/write device that reads from or writes to an optical memory medium. The pickup 350 comprises: a surface emitting laser module, which includes the surface emitting semiconductor laser element 100, 200, a substrate 354, an electrode 356, a drive IC 358 and resin 360 that seals all of these elements, a lens 376, a half mirror 370, a diffraction grating 374, an optic sensor 380 and an optical memory medium 372. The output surface of the resin 360 is processed such that it has a convex shape and forms a lens 362. The electrode 356 is electrically connected to an external control circuit (not shown in the figure), and controls the light emission of the laser pickup. The laser light that is emitted from the surface emitting semiconductor element 100, 200 is made into parallel light by the lens 362, and after being reflected by the half mirror 370, is collected by the lens 376 and focused on a specified location of the optical memory medium 372. Moreover, the light that is reflected by the optical medium is shone onto an optical sensor 380. Here, examples were given of applying the surface emitting semiconductor laser element 100, 200 of the preferred embodiment of the present invention described above, or a surface emitting laser element array having a plurality of the surface emitting semiconductor laser elements 100, 200 to an optical element package for communications, or to a pickup for an optical disc, however, applications are not limited to this, and it is also possible to use measurement equipment, a laser pointer, an optical mouse, a printer, an optical source for scanning exposure of photoresist, a light source for laser pumping, and a light source of a fiber laser for processing as the optical device.

Figure 20:
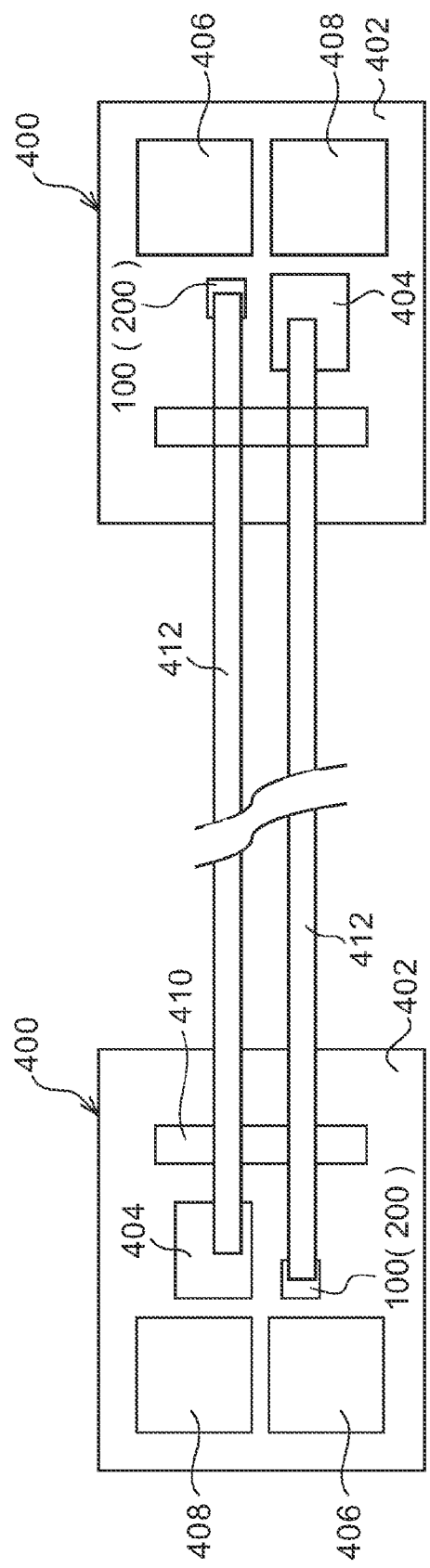
FIG. 20 is a top view for explaining an optical transmission and receiving modules that use a surface emitting semiconductor laser element of the first and second preferred embodiments of the present invention.

FIG. 20 is a drawing of the construction of a light transmission/reception module to which the surface emitting semiconductor laser element 100, 200 of the preferred embodiment of the present invention described above is applied. As illustrated in FIG. 20, the light transmission/reception module 400 comprises: a retaining member 402, optical waveguides (optic fibers) 412, a spacer 410 for positioning the optical waveguides (optic fibers) 412 on the retaining member 402, surface emitting semiconductor element 100, 200 or surface emitting laser element array having a plurality of surface emitting semiconductor laser elements 100, 200 that transmits optical signals and a light receiving element 404 that receives optical signals via the optical waveguides (optic fibers) 412, a drive circuit that controls the light emitting state of the surface emitting semiconductor laser element 100, 200 or surface emitting laser element array and an amplifier circuit 408 that amplifies the signals received by the light receiving element 404. The light emission of the surface emitting semiconductor laser element 100, 200 or surface emitting laser element array is controlled by a control signal from an external control unit (not shown in the figure) via a drive circuit 406, and a signal that is received by the light receiving element 404 is sent to the control unit via the amplifier circuit 408. In order to avoid complication, the wire bonding between the drive circuit 406 and the surface emitting semiconductor laser element 100, 200 or surface emitting laser element array, and between the amplifier circuit 408 and the light receiving element 404 is omitted.

Figure 21:
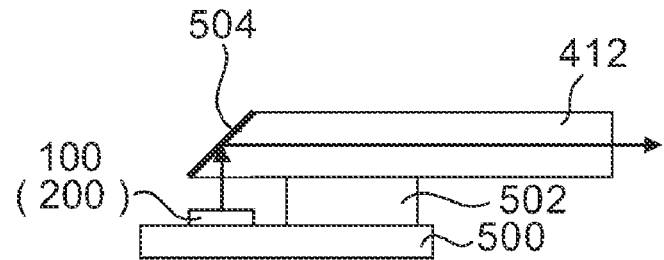
FIG. 21 is a vertical cross-sectional drawing for explaining the optical coupling structure between an optical waveguide and a surface emitting semiconductor laser element of the first and second preferred embodiments of the present invention, or an optical waveguide and a surface emitting laser array that uses a plurality of surface emitting semiconductor laser elements of the first and second preferred embodiments of the present invention.
Figure 22:
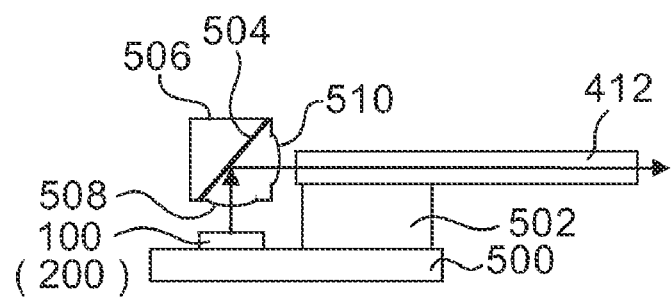
FIG. 22 is a vertical cross-sectional drawing for explaining the optical coupling structure between an optical waveguide and a surface emitting semiconductor laser element of the first and second preferred embodiments of the present invention, or an optical waveguide and a surface emitting laser array that uses a plurality of surface emitting semiconductor laser elements of the first and second preferred embodiments of the present invention.
Figure 23:
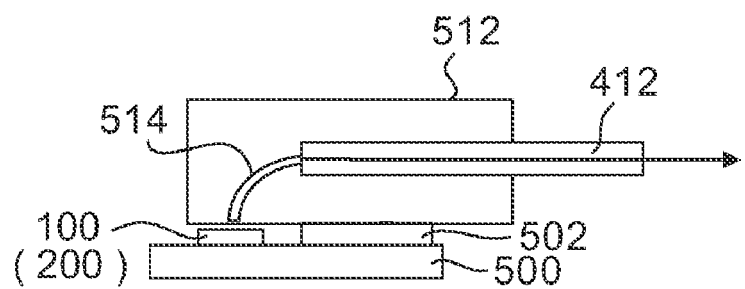
FIG. 23 is a vertical cross-sectional drawing for explaining the optical coupling structure between an optical waveguide and a surface emitting semiconductor laser element of the first and second preferred embodiments of the present invention, or an optical waveguide and a surface emitting laser array that uses a plurality of surface emitting semiconductor laser elements of the first and second preferred embodiments of the present invention.

FIG. 21 to FIG. 23 are drawings of the construction of the optical coupling between the surface emitting semiconductor laser element 100, 200 or surface emitting laser array and an optical waveguide 412 in FIG. 20, where the substrate 500, surface emitting semiconductor laser element 100, 200 or surface emitting laser array and optical waveguide 412 are common in FIG. 21 to FIG. 23. In FIG. 21, the end surface of the optical waveguide 412 is processed so that it is inclined at an angle of nearly 45 degrees with respect to the optical axis, and furthermore, this inclined surface acts as a reflective surface 504, and is processed with a mirror-like finish such as a reflective film coating, and is such that the light emitted from the surface emitting semiconductor laser element 100, 200 or surface emitting laser element array is incident on the waveguide from the bottom surface of the waveguide 412, is reflected by the inclined surface 504 and propagates inside the waveguide 412. In FIG. 22, above the surface emitting semiconductor laser element 100, 200 or surface emitting laser array, there is a mirror assembly 506 having a reflective surface 504 on the inside on the side of the end surface of the optical waveguide 412, and is such that the light emitted from the surface emitting semiconductor laser element 100, 200 or surface emitting laser array is incident from the bottom surface of the mirror assembly 506 and is reflected by the reflective surface 504, with the light that is emitted from the mirror assembly being optically coupled with the optical waveguide such that it propagates inside the optical waveguide 412. A microlens (array) can be provided on the incident surface and/or emitting surface of the mirror assembly 506. In FIG. 23, an optic fiber is arranged inside a connector housing 512, with the end section of a curved section 514 of optic fiber core being arranged such that it faces the surface emitting semiconductor laser element 100, 200 or surface emitting laser array, and such that the light emitted from the surface emitting semiconductor laser element 100, 200 or surface emitting laser array is optically coupled with the optic fiber 412.

Figure 24:
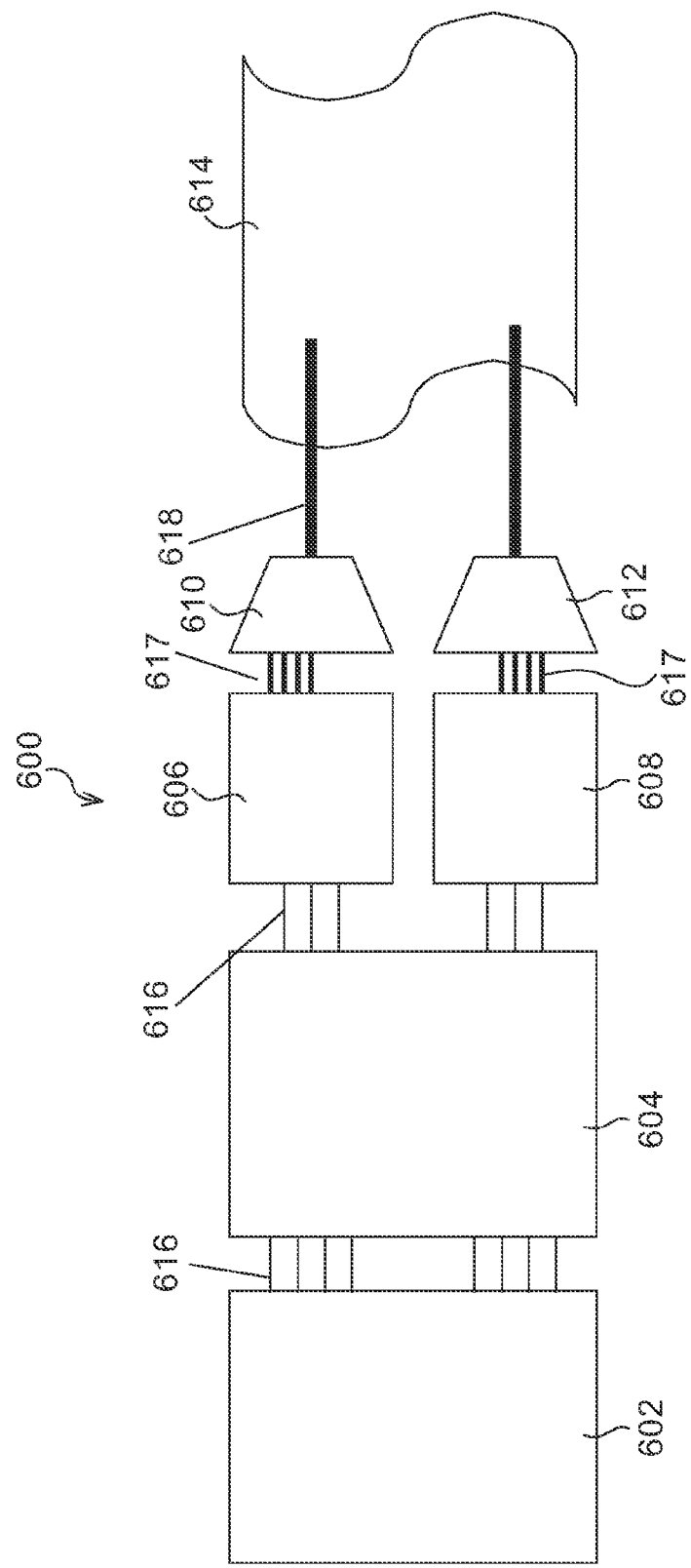
FIG. 24 is a configuration diagram for explaining a communication system that uses a surface emitting laser array that uses a plurality of surface emitting semiconductor laser elements of the first and second preferred embodiments of the present invention.

Next, an example of applying the surface emitting semiconductor laser element 100, 200 or surface emitting laser array of the preferred embodiments of the present invention described above to a communications system is given. FIG. 24 is an example of the construction of a multiple-wavelength transmission system that uses a surface emitting semiconductor laser element 100, 200 or surface emitting laser array. The multiple-wavelength transmission system illustrated in FIG. 24 comprises: a computer, a board or chip 602, a communication control circuit (CPU, MPU, optical-to-electrical conversion circuit, electrical-to-optical conversion circuit, wavelength control circuit) 604, a surface emitting laser element array 606 having a plurality of surface emitting semiconductor laser elements 100, 200, a light-receiving element integration section 608, an optical multiplexer 610, an optical branching filter 612, electrical wiring 616, optical fibers 617, 618, a communication network, PC, board, chips and the like 614. In the multiple-wavelength transmission system in FIG. 24, a plurality of surface emitting laser elements have different oscillation wavelengths for a surface emitting laser array 606, where light of each oscillating frequency from each surface emitting laser element passes through the optical multiplexer 610, so that the light is optically coupled with one optic fiber. With this kind of construction, it is possible to transmit a large volume of signals using one optic fiber and at high throughput. The operating mode of the surface emitting laser array of the preferred embodiments of the present invention is stable, and each oscillation wavelength is stable, so in this way, it is possible to perform a large volume of multiple-wavelength transmission with high reliability and high density. In this embodiment, the output optic fiber or input optic fiber from each surface emitting laser array 606 or light-receiving element integration section 608 is optically coupled to one optic fiber by using an optical multiplexer 610 or optical branching filter 612, however, depending on the use, the output optic fiber or input optic fiber can be connected as is to the communication network, PC, board, chip and the like 614 to form a parallel transmission system. In this case, the operating mode of the surface emitting laser array of the preferred embodiments of the present invention is stable and each wavelength is stable, so it becomes easier to build a highly reliable parallel transmission system having a plurality of light sources.

Various exemplary embodiments of the present invention were explained above, however, the invention is not limited to these embodiments. The scope of the present invention is only limited by the range of the following claims.

What is claimed is:

1. A semiconductor light emitting element, comprising:
  a surface emitting laser, including:
    a first reflecting mirror;
    a second reflecting mirror;
    a first electrode and a second electrode; and
    an oscillator that is provided between said first reflecting mirror and said second reflecting mirror, wherein the oscillator includes:
      an active layer;
      a semiconductor layer between said active layer and said first electrode;
      a dielectric layer that is provided on said semiconductor layer and through which light from said active layer passes; and
      a current path restriction layer,
  and wherein:
    the first electrode and the second electrode are configured to inject current to the active layer,
    said first electrode is provided on said semiconductor layer, has an opening through which light from said active layer passes, and comprises a first electrode layer that comes in contact with and is provided on said semiconductor layer, and a second electrode layer that is provided on said first electrode layer, with said first electrode layer having less reactivity with said semiconductor layer than said second electrode layer,
    said dielectric layer is provided mainly inside said opening such that the end section on the opening side of said first electrode layer extends from the top of said semiconductor layer to the top of said dielectric layer,
    the oscillator forms a mesapost,
    said first reflecting mirror is made of multilayered dielectric films and is provided on top of said first electrode and said dielectric layer, and on a side wall of the mesapost,
    said dielectric layer is a phase adjustment layer for adjusting the phase of a standing wave inside said oscillator, and said current path restriction layer restricts the path of the current that flows between said first electrode and second electrode, and has a first area through which said current flows and a second area that restricts the flow of said current.

2. The semiconductor light emitting element of claim 1, wherein said dielectric layer is disk shaped and said first electrode is ring shaped.

3. The semiconductor light emitting element of claim 1, wherein said first electrode layer extends 100 nm to 1 um over the top of said dielectric layer.

4. The semiconductor light emitting element of claim 1, wherein said first electrode layer comprises at least one material selected from the group consisting of Ti, W, Mo, Ta, Cr, TiN and TaN.

5. The semiconductor light emitting element of claim 4, wherein said second electrode layer comprises at least one material selected from the group consisting of Au, Pt, Ni, Pd and Ge.

6. The semiconductor light emitting element of claim 1, wherein the film thickness of said first electrode layer is 10 to 200 nm.

7. The semiconductor light emitting element of claim 1, wherein a material layer having a thickness of not less than 10 nm and no greater than 60 nm and including at least one of the component materials of said first electrode layer and at least one of the component materials of said semiconductor layer is located between said first electrode layer and said semiconductor layer.

8. A semiconductor light emitting element array comprising a plurality of the semiconductor light emitting elements of claim 1.

9. A laser array comprising a plurality of the semiconductor light emitting elements of claim 1.

10. An optical device comprising the semiconductor light emitting element of claim 1.

11. A communication system comprising the semiconductor light emitting element of claim 1.

* * * * *